US010065186B2

(12) United States Patent
Kolb et al.

(10) Patent No.: US 10,065,186 B2
(45) Date of Patent: Sep. 4, 2018

(54) FLUIDIC CIRCUITS AND RELATED MANUFACTURING METHODS

(71) Applicant: Micronics, Inc., Redmond, WA (US)

(72) Inventors: Andrew Kolb, Seattle, WA (US); Isaac Sprague, Kirkland, WA (US); Justin L. Kay, Renton, WA (US); Matthew Scott Bragd, Mercer Island, WA (US); Martha Stone, Redmond, WA (US)

(73) Assignee: MICRONICS, INC., Redmond, WA (US)

( * ) Notice: Subject to any disclaimer, the term of this patent is extended or adjusted under 35 U.S.C. 154(b) by 118 days.

(21) Appl. No.: 14/653,731

(22) PCT Filed: Dec. 20, 2013

(86) PCT No.: PCT/US2013/077252
§ 371 (c)(1),
(2) Date: Mar. 15, 2016

(87) PCT Pub. No.: WO2014/100732
PCT Pub. Date: Jun. 26, 2014

(65) Prior Publication Data
US 2015/0352549 A1  Dec. 10, 2015

Related U.S. Application Data

(60) Provisional application No. 61/745,335, filed on Dec. 21, 2012.

(51) Int. Cl.
*B01L 3/00* (2006.01)
*F16K 99/00* (2006.01)
(Continued)

(52) U.S. Cl.
CPC ..... *B01L 3/50273* (2013.01); *B01L 3/502738* (2013.01); *B29C 43/021* (2013.01);
(Continued)

(58) Field of Classification Search
None
See application file for complete search history.

(56) References Cited

U.S. PATENT DOCUMENTS 3,013,467 A   12/1961 Minsky
3,799,742 A   3/1974 Coleman
(Continued)

FOREIGN PATENT DOCUMENTS

CN   1146017 A   3/1997
CN   1253625 A   5/2000
(Continued)

OTHER PUBLICATIONS

Al Zahrani et al., "Accuracy and Utility of Commercially Available Amplification and Serologic Tests for the Diagnosis of Minimal Pulmonary Tuberculosis," *Am J Respir Crit Care Med* 162:1323-1329, 2000.
(Continued)

*Primary Examiner* — Jennifer Wecker
(74) *Attorney, Agent, or Firm* — Seed Intellectual Property Law Group LLP

(57) ABSTRACT

Fluidic cartridges, and manufacture thereof, having a plurality of circuit element subtypes containing pneumatically operated diaphragm members, where the diaphragm materials are selected for yield point, chemical resistance, breathability and other properties individually according to the fluidic element subtype are provided. A process of in-situ edge-bonded decoupage for forming diaphragm members inside a cartridge, and fluidic circuits having diaphragm members as active and passive circuit elements, including pumps, valves, vents, waste receptacles, reagent reservoirs, and cuvettes with optical windows, where the material
(Continued)

composition of each individual diaphragm member may be selected from an assortment of materials during manufacture are also provided.

7 Claims, 18 Drawing Sheets

(51) Int. Cl.
  *B81B 3/00* (2006.01)
  *B81C 1/00* (2006.01)
  *B29C 43/02* (2006.01)
  *B29C 65/16* (2006.01)
  *F04B 43/04* (2006.01)
  *B29K 101/00* (2006.01)
  *B29L 9/00* (2006.01)
  *B29L 31/00* (2006.01)

(52) U.S. Cl.
  CPC .......... *B29C 65/16* (2013.01); *B81C 1/00119* (2013.01); *F04B 43/043* (2013.01); *F16K 99/0015* (2013.01); *F16K 99/0059* (2013.01); *B01L 3/502707* (2013.01); *B01L 2200/0689* (2013.01); *B01L 2200/12* (2013.01); *B01L 2300/0816* (2013.01); *B01L 2300/0874* (2013.01); *B01L 2300/0887* (2013.01); *B01L 2300/123* (2013.01); *B01L 2400/0481* (2013.01); *B01L 2400/0487* (2013.01); *B01L 2400/0638* (2013.01); *B01L 2400/0655* (2013.01); *B29K 2101/00* (2013.01); *B29L 2009/00* (2013.01); *B29L 2031/7496* (2013.01); *B81B 2201/052* (2013.01); *F16K 2099/008* (2013.01); *F16K 2099/0078* (2013.01); *F16K 2099/0084* (2013.01); *F16K 2099/0086* (2013.01); *Y10T 156/1026* (2015.01)

(56) References Cited

U.S. PATENT DOCUMENTS

| | | |
|---|---|---|
| 3,996,345 A | 12/1976 | Ullman et al. |
| 4,104,029 A | 8/1978 | Maier, Jr. |
| 4,235,960 A | 11/1980 | Sasse et al. |
| 4,304,257 A | 12/1981 | Webster |
| 4,366,241 A | 12/1982 | Tom et al. |
| 4,373,932 A | 2/1983 | Gribnau et al. |
| 4,610,678 A | 9/1986 | Weisman et al. |
| 4,683,195 A | 7/1987 | Mullis et al. |
| 4,683,202 A | 7/1987 | Mullis |
| 4,788,729 A | 12/1988 | Walker |
| 4,798,703 A | 1/1989 | Minekane |
| 4,800,159 A | 1/1989 | Mullis et al. |
| 4,810,630 A | 3/1989 | Craig et al. |
| 4,833,332 A | 5/1989 | Robertson, Jr. et al. |
| 4,837,168 A | 6/1989 | de Jaeger et al. |
| 4,848,722 A | 7/1989 | Webster |
| 4,855,240 A | 8/1989 | Rosenstein et al. |
| 4,869,282 A | 9/1989 | Sittler et al. |
| 4,883,750 A | 11/1989 | Whiteley et al. |
| 4,943,522 A | 7/1990 | Eisinger et al. |
| 4,956,302 A | 9/1990 | Gordon et al. |
| 4,965,188 A | 10/1990 | Mullis et al. |
| 5,038,852 A | 8/1991 | Johnson et al. |
| 5,075,078 A | 12/1991 | Osikowicz et al. |
| 5,100,626 A | 3/1992 | Levin |
| 5,120,643 A | 6/1992 | Ching et al. |
| 5,130,238 A | 7/1992 | Malek et al. |
| 5,141,850 A | 8/1992 | Cole et al. |
| 5,160,701 A | 11/1992 | Brown, III et al. |
| 5,192,980 A | 3/1993 | Dixon et al. |
| 5,225,163 A | 7/1993 | Andrews |
| 5,234,809 A | 8/1993 | Boom et al. |
| 5,252,459 A | 10/1993 | Tarcha et al. |
| 5,270,183 A | 12/1993 | Corbett et al. |
| 5,275,785 A | 1/1994 | May et al. |
| 5,296,703 A | 3/1994 | Tsien |
| 5,304,487 A | 4/1994 | Wilding et al. |
| 5,354,668 A | 10/1994 | Auerbach |
| 5,415,994 A | 5/1995 | Imrich et al. |
| 5,420,016 A | 5/1995 | Boguslaski et al. |
| 5,427,930 A | 6/1995 | Birkenmeyer et al. |
| 5,443,890 A | 8/1995 | Öhman |
| 5,455,166 A | 10/1995 | Walker |
| 5,486,335 A | 1/1996 | Wilding et al. |
| 5,498,392 A | 3/1996 | Wilding et al. |
| 5,504,013 A | 4/1996 | Senior |
| 5,543,026 A | 8/1996 | Hoff et al. |
| 5,578,818 A | 11/1996 | Kain et al. |
| 5,582,989 A | 12/1996 | Caskey et al. |
| 5,587,128 A | 12/1996 | Wilding et al. |
| 5,591,645 A | 1/1997 | Rosenstein |
| 5,602,040 A | 2/1997 | May et al. |
| 5,622,871 A | 4/1997 | May et al. |
| 5,631,734 A | 5/1997 | Stern et al. |
| 5,635,358 A | 6/1997 | Wilding et al. |
| 5,635,602 A | 6/1997 | Cantor et al. |
| 5,639,428 A | 6/1997 | Cottingham |
| 5,656,503 A | 8/1997 | May et al. |
| 5,658,723 A | 8/1997 | Oberhardt |
| 5,660,370 A | 8/1997 | Webster |
| 5,660,990 A | 8/1997 | Rao et al. |
| 5,670,381 A | 9/1997 | Jou et al. |
| 5,707,807 A | 1/1998 | Kato |
| 5,716,842 A | 2/1998 | Baier et al. |
| 5,716,852 A | 2/1998 | Yager et al. |
| 5,718,567 A | 2/1998 | Rapp et al. |
| 5,724,404 A | 3/1998 | Garcia et al. |
| 5,726,026 A | 3/1998 | Wilding et al. |
| 5,726,404 A | 3/1998 | Brody |
| 5,726,751 A | 3/1998 | Altendorf et al. |
| 5,730,850 A | 3/1998 | Kambara et al. |
| 5,747,349 A | 5/1998 | van den Engh et al. |
| 5,748,827 A | 5/1998 | Holl et al. |
| 5,759,014 A | 6/1998 | Van Lintel |
| 5,770,460 A | 6/1998 | Pawlak et al. |
| 5,798,273 A | 8/1998 | Shuler et al. |
| 5,856,174 A | 1/1999 | Lipshutz et al. |
| 5,863,502 A | 1/1999 | Southgate et al. |
| 5,863,801 A | 1/1999 | Southgate et al. |
| 5,872,710 A | 2/1999 | Kameyama |
| 5,906,602 A | 5/1999 | Weber et al. |
| 5,922,210 A | 7/1999 | Brody et al. |
| 5,922,591 A | 7/1999 | Anderson et al. |
| 5,932,100 A | 8/1999 | Yager et al. |
| 5,932,799 A | 8/1999 | Moles |
| 5,948,684 A | 9/1999 | Weigl et al. |
| 5,955,029 A | 9/1999 | Wilding et al. |
| 5,965,410 A | 10/1999 | Chow et al. |
| 5,971,158 A | 10/1999 | Yager et al. |
| 5,971,355 A | 10/1999 | Biegelsen et al. |
| 5,972,710 A | 10/1999 | Weigl et al. |
| 5,972,721 A | 10/1999 | Bruno et al. |
| 5,974,867 A | 11/1999 | Forster et al. |
| 5,989,813 A | 11/1999 | Gerdes |
| 6,001,307 A | 12/1999 | Naka et al. |
| 6,007,309 A | 12/1999 | Hartley |
| 6,007,775 A | 12/1999 | Yager |
| 6,018,616 A | 1/2000 | Schaper |
| 6,020,187 A | 2/2000 | Tam |
| 6,037,168 A | 3/2000 | Brown |
| 6,057,167 A | 5/2000 | Shieh et al. |
| 6,068,752 A | 5/2000 | Dubrow et al. |
| 6,086,740 A | 7/2000 | Kennedy |
| 6,158,712 A | 12/2000 | Craig |
| 6,168,948 B1 | 1/2001 | Anderson et al. |
| 6,171,865 B1 | 1/2001 | Weigl et al. |
| 6,184,029 B1 | 2/2001 | Wilding et al. |
| 6,210,514 B1 | 4/2001 | Cheung et al. |
| 6,210,882 B1 | 4/2001 | Landers et al. |
| 6,272,939 B1 | 8/2001 | Frye et al. |

(56) References Cited

U.S. PATENT DOCUMENTS

| | | |
|---|---|---|
| 6,287,850 B1 | 9/2001 | Besemer et al. |
| 6,303,389 B1 | 10/2001 | Levin et al. |
| 6,309,875 B1 | 10/2001 | Gordon |
| 6,325,975 B1 | 12/2001 | Naka et al. |
| 6,326,211 B1 | 12/2001 | Anderson et al. |
| 6,368,876 B1 | 4/2002 | Huang et al. |
| 6,387,290 B1 | 5/2002 | Brody et al. |
| 6,390,791 B1 | 5/2002 | Maillefer et al. |
| 6,399,398 B1 | 6/2002 | Cunningham et al. |
| 6,418,968 B1 | 7/2002 | Pezzuto et al. |
| 6,431,212 B1 | 8/2002 | Hayenga et al. |
| 6,439,036 B1 | 8/2002 | Mansky |
| 6,468,807 B1 | 10/2002 | Svensson et al. |
| 6,488,896 B2 | 12/2002 | Weigl et al. |
| 6,506,346 B1 | 1/2003 | Monro |
| 6,541,213 B1 | 4/2003 | Weigl et al. |
| 6,541,274 B2 | 4/2003 | Nagle et al. |
| 6,562,209 B1 | 5/2003 | Sullivan et al. |
| 6,569,674 B1 | 5/2003 | McGarry et al. |
| 6,576,459 B2 | 6/2003 | Miles et al. |
| 6,581,899 B2 | 6/2003 | Williams |
| 6,614,030 B2 | 9/2003 | Maher et al. |
| 6,620,273 B2 | 9/2003 | Dai et al. |
| 6,632,655 B1 | 10/2003 | Mehta et al. |
| 6,635,487 B1 | 10/2003 | Lee et al. |
| 6,637,463 B1 | 10/2003 | Lei et al. |
| 6,664,104 B2 | 12/2003 | Pourahmadi et al. |
| 6,720,411 B2 | 4/2004 | Mirkin et al. |
| 6,729,352 B2 | 5/2004 | O'Connor et al. |
| 6,731,178 B2 | 5/2004 | Gailhard et al. |
| 6,731,781 B1 | 5/2004 | Shams et al. |
| 6,743,399 B1 | 6/2004 | Weigl et al. |
| 6,748,975 B2 | 6/2004 | Hartshorne et al. |
| 6,758,107 B2 | 7/2004 | Cabuz |
| 6,767,194 B2 | 7/2004 | Jeon et al. |
| 6,787,338 B2 | 9/2004 | Wittwer et al. |
| 6,793,753 B2 | 9/2004 | Unger et al. |
| 6,815,160 B1 | 11/2004 | Chien et al. |
| 6,843,263 B2 | 1/2005 | Kuo et al. |
| 6,872,566 B2 | 3/2005 | Vischer et al. |
| 6,901,949 B2 | 6/2005 | Cox et al. |
| 6,916,113 B2 | 7/2005 | Van de Goor et al. |
| 6,951,632 B2 | 10/2005 | Unger et al. |
| 6,953,675 B2 | 10/2005 | Leung et al. |
| 6,953,676 B1 | 10/2005 | Wilding et al. |
| 6,955,738 B2 | 10/2005 | Derand et al. |
| 6,974,119 B2 | 12/2005 | Brendle et al. |
| 6,974,669 B2 | 12/2005 | Mirkin et al. |
| 7,010,391 B2 | 3/2006 | Handique et al. |
| 7,052,594 B2 | 5/2006 | Pelrine et al. |
| 7,087,414 B2 | 8/2006 | Gerdes et al. |
| 7,141,416 B2 | 11/2006 | Krutzik |
| 7,153,673 B2 | 12/2006 | Stern |
| 7,223,363 B2 | 5/2007 | McNeely et al. |
| 7,223,371 B2 | 5/2007 | Hayenga et al. |
| 7,226,562 B2 | 6/2007 | Holl et al. |
| 7,235,400 B2 | 6/2007 | Adey |
| 7,318,913 B2 | 1/2008 | Loeffler et al. |
| 7,416,892 B2 | 8/2008 | Battrell et al. |
| 7,445,926 B2 | 11/2008 | Mathies et al. |
| 7,514,212 B2 | 4/2009 | Prudent et al. |
| 7,517,651 B2 | 4/2009 | Marshall et al. |
| 7,541,147 B2 | 6/2009 | Marshall et al. |
| 7,544,506 B2 | 6/2009 | Breidford et al. |
| 7,607,641 B1 | 10/2009 | Yuan |
| 7,615,370 B2 | 11/2009 | Streit et al. |
| 7,648,835 B2 | 1/2010 | Breidford et al. |
| 7,695,683 B2 | 4/2010 | Quan et al. |
| 7,749,444 B2 | 7/2010 | Yamada et al. |
| 7,763,453 B2 | 7/2010 | Clemmens et al. |
| 7,785,776 B2 | 8/2010 | Wittwer et al. |
| 7,832,429 B2 | 11/2010 | Young et al. |
| 7,906,317 B2 | 3/2011 | Lee et al. |
| 7,955,836 B2 | 6/2011 | Clemmens et al. |
| 8,104,497 B2 | 1/2012 | Unger et al. |
| 8,104,514 B2 | 1/2012 | Fernandes et al. |
| 8,110,392 B2 | 2/2012 | Battrell et al. |
| 8,222,023 B2 | 7/2012 | Battrell et al. |
| 8,329,453 B2 | 12/2012 | Battrell et al. |
| 8,431,389 B2 | 4/2013 | Battrell et al. |
| 8,716,007 B2 | 5/2014 | Battrell et al. |
| 8,747,779 B2 | 6/2014 | Sprague et al. |
| 8,772,017 B2 | 7/2014 | Battrell et al. |
| 9,056,291 B2 | 6/2015 | Battrell et al. |
| 9,132,423 B2 | 9/2015 | Battrell et al. |
| 2001/0046701 A1 | 11/2001 | Schulte et al. |
| 2002/0081934 A1 | 6/2002 | Murao et al. |
| 2002/0086443 A1 | 7/2002 | Bamdad |
| 2002/0137196 A1 | 9/2002 | Miles et al. |
| 2002/0160518 A1 | 10/2002 | Hayenga et al. |
| 2002/0192676 A1 | 12/2002 | Madonna et al. |
| 2002/0195152 A1 | 12/2002 | Fernandes et al. |
| 2003/0008308 A1 | 1/2003 | Enzelberger et al. |
| 2003/0013184 A1 | 1/2003 | Streit et al. |
| 2003/0032028 A1 | 2/2003 | Dace et al. |
| 2003/0073229 A1 | 4/2003 | Greenstein et al. |
| 2003/0124619 A1 | 7/2003 | Weigl et al. |
| 2003/0129756 A1 | 7/2003 | Thorne et al. |
| 2003/0136178 A1 | 7/2003 | Cabuz |
| 2003/0152927 A1 | 8/2003 | Jakobsen et al. |
| 2003/0175990 A1 | 9/2003 | Hayenga et al. |
| 2003/0215825 A1 | 11/2003 | Tong |
| 2003/0224434 A1 | 12/2003 | Wittwer et al. |
| 2004/0005718 A1 | 1/2004 | Fukushima |
| 2004/0018611 A1 | 1/2004 | Ward et al. |
| 2004/0024051 A1 | 2/2004 | Holton |
| 2004/0037739 A1 | 2/2004 | McNeely et al. |
| 2004/0081997 A1 | 4/2004 | Stern |
| 2004/0115094 A1 | 6/2004 | Gumbrecht et al. |
| 2004/0121364 A1 | 6/2004 | Chee et al. |
| 2004/0124384 A1 | 7/2004 | Biegelsen et al. |
| 2004/0189311 A1 | 9/2004 | Glezer et al. |
| 2004/0209354 A1 | 10/2004 | Mathies et al. |
| 2004/0224339 A1 | 11/2004 | Numajiri et al. |
| 2004/0226348 A1 | 11/2004 | Bruce, III et al. |
| 2004/0248167 A1 | 12/2004 | Quake et al. |
| 2005/0013732 A1 | 1/2005 | Battrell et al. |
| 2005/0019792 A1 | 1/2005 | McBride et al. |
| 2005/0019898 A1 | 1/2005 | Adey et al. |
| 2005/0037397 A1 | 2/2005 | Mirkin et al. |
| 2005/0106066 A1 | 5/2005 | Saltsman et al. |
| 2005/0106742 A1 | 5/2005 | Wahl et al. |
| 2005/0129582 A1 | 6/2005 | Breidford et al. |
| 2005/0136552 A1 | 6/2005 | Buechler |
| 2005/0142582 A1 | 6/2005 | Doyle et al. |
| 2005/0157301 A1 | 7/2005 | Chediak et al. |
| 2005/0161669 A1 | 7/2005 | Jovanovich et al. |
| 2005/0164373 A1 | 7/2005 | Oldham et al. |
| 2005/0186585 A1 | 8/2005 | Juncosa et al. |
| 2005/0205816 A1 | 9/2005 | Hayenga et al. |
| 2005/0217741 A1 | 10/2005 | Bohm |
| 2005/0221281 A1 | 10/2005 | Ho |
| 2005/0284817 A1 | 12/2005 | Fernandez et al. |
| 2006/0003440 A1 | 1/2006 | Streit et al. |
| 2006/0073484 A1 | 4/2006 | Mathies et al. |
| 2006/0076068 A1 | 4/2006 | Young et al. |
| 2006/0127886 A1 | 6/2006 | Kaylor et al. |
| 2006/0166375 A1 | 7/2006 | Hawkins et al. |
| 2006/0178568 A1 | 8/2006 | Danna et al. |
| 2006/0246575 A1 | 11/2006 | Lancaster et al. |
| 2006/0263816 A1 | 11/2006 | Laikhter et al. |
| 2006/0264782 A1 | 11/2006 | Holmes et al. |
| 2006/0275852 A1 | 12/2006 | Montagu et al. |
| 2006/0275893 A1 | 12/2006 | Ishii et al. |
| 2006/0292588 A1 | 12/2006 | Chou et al. |
| 2006/0292630 A1 | 12/2006 | Fukumoto |
| 2007/0008536 A1 | 1/2007 | Mitani et al. |
| 2007/0009383 A1 | 1/2007 | Bedingham et al. |
| 2007/0014695 A1 | 1/2007 | Yue et al. |
| 2007/0042427 A1 | 2/2007 | Gerdes et al. |
| 2007/0125947 A1 | 6/2007 | Sprinzak et al. |
| 2007/0154895 A1 | 7/2007 | Spaid et al. |
| 2007/0183935 A1 | 8/2007 | Clemmens et al. |
| 2007/0190525 A1 | 8/2007 | Gu et al. |

(56) References Cited

U.S. PATENT DOCUMENTS

| | | |
|---|---|---|
| 2007/0219366 A1 | 9/2007 | Gumbrecht et al. |
| 2007/0234785 A1 | 10/2007 | Beerling et al. |
| 2007/0243603 A1 | 10/2007 | Einsle et al. |
| 2007/0280856 A1 | 12/2007 | Ulmanella et al. |
| 2007/0292858 A1 | 12/2007 | Chen et al. |
| 2008/0050283 A1 | 2/2008 | Chou et al. |
| 2008/0081341 A1 | 4/2008 | Maher et al. |
| 2008/0226500 A1 | 9/2008 | Shikida et al. |
| 2008/0260586 A1 | 10/2008 | Boamfa |
| 2008/0274511 A1 | 11/2008 | Tan et al. |
| 2008/0297792 A1 | 12/2008 | Kim et al. |
| 2009/0000678 A1 | 1/2009 | Therriault et al. |
| 2009/0017483 A1 | 1/2009 | Yamaoka et al. |
| 2009/0047713 A1 | 2/2009 | Handique |
| 2009/0061450 A1 | 3/2009 | Hunter |
| 2009/0148847 A1 | 6/2009 | Kokoris et al. |
| 2009/0148933 A1 | 6/2009 | Battrell et al. |
| 2009/0181411 A1 | 12/2009 | Battrell et al. |
| 2009/0298059 A1 | 12/2009 | Gumbrecht et al. |
| 2009/0325203 A1 | 12/2009 | Jenny et al. |
| 2009/0325276 A1 | 12/2009 | Battrell et al. |
| 2010/0041049 A1 | 2/2010 | Smith et al. |
| 2010/0112723 A1 | 5/2010 | Battrell et al. |
| 2010/0120129 A1* | 5/2010 | Amshey ............ B01L 3/502715 435/270 |
| 2010/0291588 A1 | 11/2010 | McDevitt et al. |
| 2010/0303687 A1* | 12/2010 | Blaga ................ B01L 3/50273 422/504 |
| 2011/0151479 A1 | 6/2011 | Stevens et al. |
| 2011/0207621 A1 | 8/2011 | Montagu et al. |
| 2012/0028342 A1 | 2/2012 | Ismagilov et al. |
| 2012/0064597 A1 | 3/2012 | Clemmens et al. |
| 2012/0071342 A1 | 3/2012 | Lochhead et al. |
| 2012/0115214 A1 | 5/2012 | Battrell et al. |
| 2012/0135511 A1 | 5/2012 | Battrell et al. |
| 2012/0156750 A1 | 6/2012 | Battrell et al. |
| 2012/0164383 A1 | 6/2012 | Sollmann |
| 2012/0164627 A1 | 6/2012 | Battrell et al. |
| 2012/0177543 A1 | 7/2012 | Battrell et al. |
| 2012/0329142 A1 | 12/2012 | Battrell et al. |
| 2013/0011912 A1 | 1/2013 | Battrell et al. |
| 2013/0032235 A1* | 2/2013 | Johnstone ............ F04B 43/02 137/833 |
| 2013/0130262 A1* | 5/2013 | Battrell ............ B01L 3/50273 435/6.12 |
| 2014/0349381 A1 | 11/2014 | Battrell et al. |
| 2015/0158026 A1 | 6/2015 | Battrell et al. |
| 2015/0321193 A1 | 11/2015 | Sprague et al. |
| 2015/0346097 A1 | 12/2015 | Battrell et al. |
| 2016/0090588 A1 | 3/2016 | Lofquist et al. |
| 2016/0102340 A1 | 4/2016 | Bouzek |
| 2017/0113221 A1 | 4/2017 | Hoffman et al. |

FOREIGN PATENT DOCUMENTS

| | | |
|---|---|---|
| CN | 102602087 A | 7/2012 |
| DE | 20 2004 012 163 U1 | 11/2004 |
| EP | 0 320 308 A2 | 6/1989 |
| EP | 0 329 822 A2 | 8/1989 |
| EP | 0 399 859 A1 | 11/1990 |
| EP | 0 517 631 A1 | 12/1992 |
| EP | 1 180 135 B1 | 8/2005 |
| EP | 1 659 405 A1 | 5/2006 |
| EP | 1 707 965 A1 | 10/2006 |
| EP | 1 726 940 A1 | 11/2006 |
| EP | 1 792 654 A2 | 6/2007 |
| EP | 2 202 328 A1 | 6/2010 |
| GB | 2 202 328 A | 9/1988 |
| JP | 52-55679 A | 5/1977 |
| JP | 61-137066 A | 6/1986 |
| JP | 7-151101 A | 6/1995 |
| JP | 2520468 Y2 | 9/1996 |
| JP | 10-82773 A | 3/1998 |
| JP | 10-504916 A | 5/1998 |
| JP | 11-508347 A | 7/1999 |
| JP | 2000-314719 A | 11/2000 |
| JP | 2003-166910 A | 6/2003 |
| JP | 2003-207454 A | 7/2003 |
| JP | 2004-028589 A | 1/2004 |
| JP | 2004-333452 A | 11/2004 |
| JP | 2005-512071 A | 4/2005 |
| JP | 2005-527303 A | 9/2005 |
| JP | 2005-531006 A | 10/2005 |
| JP | 2005-345378 A | 12/2005 |
| JP | 2006-73371 A | 3/2006 |
| JP | 2006-84459 A | 3/2006 |
| JP | 2006-90774 A | 4/2006 |
| JP | 2006-512092 A | 4/2006 |
| JP | 2006-122743 A | 5/2006 |
| JP | 2006-517029 A | 7/2006 |
| JP | 2006-227301 A | 8/2006 |
| JP | 2006-246777 A | 9/2006 |
| JP | 2006-520190 A | 9/2006 |
| JP | 2007-514142 A | 5/2007 |
| JP | 2007-532918 A | 11/2007 |
| JP | 2008-503722 A | 2/2008 |
| JP | 2008-89597 A | 4/2008 |
| JP | 2008-96375 A | 4/2008 |
| JP | 2008-537063 A | 9/2008 |
| JP | 2009-14529 A | 1/2009 |
| JP | 2009-019962 A | 1/2009 |
| JP | 2009-510337 A | 3/2009 |
| JP | 2009-513966 A | 4/2009 |
| JP | 2009-529883 A | 8/2009 |
| JP | 2009-255083 A | 11/2009 |
| JP | 2010-78508 A | 4/2010 |
| JP | 2010-519463 A | 6/2010 |
| JP | 2010-535346 A | 11/2010 |
| JP | 2012-516455 A | 7/2012 |
| JP | 2013-518289 A | 5/2013 |
| JP | 2015-510111 A | 4/2015 |
| JP | 2016-508197 A | 3/2016 |
| WO | 86/06488 | 11/1986 |
| WO | 88/08534 A1 | 11/1988 |
| WO | 88/10315 A1 | 12/1988 |
| WO | 89/06700 A1 | 7/1989 |
| WO | 89/09284 A1 | 10/1989 |
| WO | 91/12336 A1 | 8/1991 |
| WO | 96/33399 A1 | 10/1996 |
| WO | 97/01055 A1 | 1/1997 |
| WO | 98/49543 A1 | 11/1998 |
| WO | 00/63670 A1 | 10/2000 |
| WO | 01/070381 A2 | 9/2001 |
| WO | 02/001184 A1 | 1/2002 |
| WO | 02/012896 A1 | 2/2002 |
| WO | 02/041994 A2 | 5/2002 |
| WO | 02/072262 A1 | 9/2002 |
| WO | 02/081934 A2 | 10/2002 |
| WO | 03/015923 A1 | 2/2003 |
| WO | 03/031977 A2 | 4/2003 |
| WO | 03/049860 A1 | 6/2003 |
| WO | 03/054523 A2 | 7/2003 |
| WO | 03/097831 A1 | 11/2003 |
| WO | 03/099355 A2 | 12/2003 |
| WO | 03/101887 A2 | 12/2003 |
| WO | 03/102546 A2 | 12/2003 |
| WO | 2004/055198 A2 | 7/2004 |
| WO | 2004/061085 A2 | 7/2004 |
| WO | 2004/065010 A2 | 8/2004 |
| WO | 2004/065930 A2 | 8/2004 |
| WO | 2005/016529 A1 | 2/2005 |
| WO | 2005/022154 A1 | 3/2005 |
| WO | 2005/066638 A1 | 7/2005 |
| WO | 2005/069015 A1 | 7/2005 |
| WO | 2005/088280 A1 | 9/2005 |
| WO | 2005/106024 A2 | 11/2005 |
| WO | 2006/018811 A1 | 2/2006 |
| WO | 2006/035830 A1 | 4/2006 |
| WO | 2006/052652 A2 | 5/2006 |
| WO | 2006/076567 A2 | 7/2006 |
| WO | 2006/083833 A2 | 8/2006 |
| WO | 2006/125767 A1 | 11/2006 |
| WO | 2007/049009 A1 | 5/2007 |

(56) References Cited

FOREIGN PATENT DOCUMENTS

| | | |
|---|---|---|
| WO | 2007/064635 A1 | 6/2007 |
| WO | 2007/106579 A2 | 9/2007 |
| WO | 2007/106580 A2 | 9/2007 |
| WO | 2007/109584 A1 | 9/2007 |
| WO | 2008/002462 A2 | 1/2008 |
| WO | 2008/070198 A2 | 6/2008 |
| WO | 2008/101732 A1 | 8/2008 |
| WO | 2008/147382 A1 | 12/2008 |
| WO | 2009/018473 A1 | 2/2009 |
| WO | 2009/037361 A1 | 3/2009 |
| WO | 2009/105711 A1 | 8/2009 |
| WO | 2010/025302 A2 | 3/2010 |
| WO | 2010/088514 A1 | 8/2010 |
| WO | 2011/094577 A2 | 8/2011 |
| WO | WO 2011094577 A2 * 8/2011 ........... B01L 3/50273 |
| WO | 2012/071069 A1 | 5/2012 |
| WO | 2013/052318 A1 | 4/2013 |
| WO | 2014/100732 A1 | 6/2014 |
| WO | 2014/182847 A1 | 11/2014 |

OTHER PUBLICATIONS

Aoki et al., "Serine Repeat Antigen (SERA5) Is Predominantly Expressed among the SERA Multigene Family of Plasmodium falciparum, and the Acquired Antibody Titers Correlate with Serum Inhibition of the Parasite Growth," *The Journal of Biological Chemistry* 277(49):47533-47540, Dec. 2002.

Arar et al., "Synthesis and Antiviral Activity of Peptide-Oligonucleotide Conjugates Prepared by Using $N_\alpha$-(Bromoacetyl)peptides," *Bioconjugate Chem.* 6(5):573-577, 1995.

Arikan et al., "Anti-Kp 90 IgA Antibodies in the Diagnosis of Active Tuberculosis," *CHEST* 114(5):1253-1257, Nov. 1998.

Birkelund, "The molecular biology and diagnostics of Chlamydia trachomatis," *Danish Medical Bulletin* 39(4):304-320, Aug. 1992.

Bongartz et al., "Improved biological activity of antisense oligonucleotides conjugated to a fusogenic peptide," *Nucleic Acids Research* 22(22):4681-4688, 1994.

Bowden et al., "Using Self-Administered Tampons to Diagnose STDs," *AIDS Patient Care and STDs* 12(1):29-32, 1998.

C. Fredrick Battrell et al., "Sample-To-Answer Microfluidic Cartridge," U.S. Appl. No. 14/819,182, filed Aug. 5, 2015, 78 pages.

Carmona et al., "The use of fluorescence resonance energy transfer (FRET) peptides for measurement of clinically important proteolytic enzymes," *An Acad Bras Cienc* 81(3):381-392.

Chan et al., "Polymer surface modification by plasmas and photons," *Surface Science Reports* 24:1-54, 1996.

Chernesky et al., "Clinical Evaluation of the Sensitivity and Specificity of a Commercially Available Enzyme Immunoassay for Detection of Rubella Virus-Specific Immunoglobulin M," *J. Clin. Microbiol.* 20(3):400-404, Sep. 1984.

Chernesky et al., "Detection of Chlamydia trachomatis Antigens by Enzyme Immunoassay and Immunofluorescence in Genital Specimens from Symptomatic and Asymptomatic Men and Women," *The Journal of Infectious Diseases* 154(1):141-148, Jul. 1986.

Chou et al., "Prevention of pre-PCR mis-priming and primer dimerization improves low-copy-number amplifications," *Nucleic Acids Research* 20(7):1717-1723, 1992.

Crotchfelt et al., "Detection of Neisseria gonorrhoeae and Chlamydia trachomatis in Genitourinary Specimens from Men and Women by a Coamplification PCR Assay," *J. Clin. Microbiol.* 35(6):1536-1540, Jun. 1997.

Cuzzubbo et al., "Use of Recombinant Envelope Proteins for Serological Diagnosis of Dengue Virus Infection in an Immunochromatographic Assay," *Clin. Diagn. Lab. Immunol.* 8(6):1150-1155, 2001.

D'Aquila et al., "Maximizing sensitivity and specificity of PCR by pre-amplification heating," *Nucleic Acids Research* 19(13):3749, 1991.

Dean et al., "Comprehensive human genome amplification using multiple displacement amplification," *PNAS* 99(8):5261-5266, Apr. 2002.

Detter et al., "Isothermal Strand-Displacement Amplification Applications for High-Throughput Genomics," *Genomics* 80(6):691-698, Dec. 2002.

Edelstein et al., "The BARC biosensor applied to the detection of biological warfare agents," *Biosensors & Bioelectronics* 14:805-813, 2000.

Eritja et al., "Synthesis of Defined Peptide-Oligonucleotide Hybrids Containing a Nuclear Transport Signal Sequence," *Tetrahedron* 47(24):4113-4120, 1991.

Fontana et al., "Performance of Strand Displacement Amplification Assay in the Detection of Chlamydia trachomatis and Neisseria gonorrhoeae,"*Jpn. J. Infect. Dis.* 58:283-288, 2005.

Frame et al., "Identification and Typing of Herpes Simplex Virus by Enzyme Immunoassay with Monoclonal Antibodies," *J. Clin. Microbiol.* 20(2):162-166, Aug. 1984.

Gallo et al., "Study of viral integration of HPV-16 in young patients with LSIL," *J Clin Pathol* 56:532-536, 2003.

Garbassi et al., *Polymer Surfaces—From Physics to Technology*, John Wiley and Sons, Baltimore, Md., 1998, pp. 238-241.

Ghai et al., "Identification, expression, and functional characterization of MAEBL, a sporozoite and asexual blood stage chimeric erythrocyte-binding protein of Plasmodium falciparum," *Molecular & Biochemical Parasitology* 123:35-45, 2002.

Gijs, "Magnetic bead handling on-chip: new opportunities for analytical applications," *Microfluid Nanofluid* 1:22-40, 2004.

Gomes et al., "Immunoreactivity and differential developmental expression of known and putative Chlamydia trachomatis membrane proteins for biologically variant serovars representing distinct disease groups," *Microbes and Infection* 7:410-420, 2005.

Graham et al., "Magnetoresistive-based biosensors and biochips," *TRENDS in Biotechnology* 22(9):455-462, Sep. 2004.

Graves et al., "Development of Antibody to Measles Virus Polypeptides During Complicated and Uncomplicated Measles Virus Infections," *Journal of Virology* 49(2):409-412, Feb. 1984.

Grover et al., "Monolithic membrane valves and diaphragm pumps for practical large-scale integration into glass microfluidic devices," *Sensors and Actuators B* 89:315-323, 2003.

Hardt et al., "Passive micromixers for applications in the microreactor and mTAS fields," *Microfluid Nanofluid* 1:108-118, 2005.

Harris et al., "Typing of Dengue Viruses in Clinical Specimens and Mosquitoes by Single-Tube Multiplex Reverse Transcriptase PCR," *J. Clin. Microbiol.* 36(9):2634-2639, Sep. 1998.

Harrison et al., "Synthesis and hybridization analysis of a small library of peptide—oligonucleotide conjugates," *Nucleic Acids Research* 26(13):3136-3145, 1998.

Hummel et al., "Development of quantitative gene-specific real-time RT-PCR assays for the detection of measles virus in clinical specimens," *Journal of Virological Methods* 132:166-173, 2006.

Hung et al., "A specificity enhancer for polymerase chain reaction," *Nucleic Acids Research* 18(16):4953, Jun. 1990.

Innis et al., (eds.), *PCR Protocols: A Guide to Methods and Applications*, Academic Press, Inc., San Diego, California, 1990, 480 pages.

Jacobs et al., "Detection of Streptococcus pneumoniae Antigen in Bronchoalveolar Lavage Fluid Samples by a Rapid Immunochromatographic Membrane Assay," *J. Clin. Microbiol.* 43(8):4037-4040, 2005.

Joung et al., "Micropumps Based on Alternating High-Gradient Magnetic Fields," *IEEE Transactions on Magnetics* 36(4):2012-2014, Jul. 2000.

Kanehisa, "Use of statistical criteria for screening potential homologies in nucleic acid sequences," *Nucleic Acids Research* 12(1):203-213, Jan. 1984.

Kellogg et al., "TaqStart Antibody: "Hot Start" PCR Facilitated by a Neutralizing Monoclonal Antibody Directed Against Taq DNA Polymerase," *BioTechniques* 16(6):1134-1137, Jun. 1994.

Kennedy et al., "Protein-Protein Coupling Reactions and the Applications of Protein Conjugates," *Clinica Chimica Acta* 70(1):1-31, Jul. 1976.

(56) References Cited

OTHER PUBLICATIONS

Khan et al., "Antibiotic Resistance, Virulence Gene, and Molecular Profiles of Shiga Toxin-Producing *Escherichia coli* Isolates from Diverse Sources in Calcutta, India," *J. Clin. Microbiol.* 40(6):2009-2015, Jun. 2002.

Khan et al., "Prevalence and Genetic Profiling of Virulence Determinants of Non-O157 Shiga Toxin-Producing *Escherichia coli* Isolated from Cattle, Beef, and Humans, Calcutta, India," *Emerging Infectious Diseases* 8(1):54-62, Jan. 2002.

Kittigul et al., "Use of a Rapid Immunochromatographic Test for Early Diagnosis of Dengue Virus Infection," *Eur. J. Clin. Microbiol. Infect. Dis.* 21(3):224-226, Mar. 2002.

Knox et al., "Evaluation of Self-Collected Samples in Contrast to Practitioner-Collected Samples for Detection of Chlamydia trachomatis, Neisseria gonorrhoeae, and Trichomonas vaginalis by Polymerase Chain Reaction Among Women Living in Remote Areas," *Sexually Transmitted Diseases* 29(11):647-654, Nov. 2002.

Kremer et al., "Measles Virus Genotyping by Nucleotide-Specific Multiplex PCR," *J. Clin. Microbiol.* 42(7):3017-3022, Jul. 2004.

Kuipers et al., "Detection of Chlamydia trachomatis in peripheral blood leukocytes of reactive arthritis patients by polymerase chain reaction," *Arthritis & Rheumatism* 41(10):1894-1895, Oct. 1998.

Kuipers et al., "Sensitivities of PCR, MicroTrak, ChlamydiaEIA, IDEIA, and PACE 2 for Purified Chlamydia trachomatis Elementary Bodies in Urine, Peripheral Blood, Peripheral Blood Leukocytes, and Synovial Fluid," *J. Clin. Microbiol.* 33(12):3186-3190, Dec. 1995.

Kuno, "Universal diagnostic RT-PCR protocol for arboviruses," *Journal of Virological Methods* 72:27-41, 1998.

Kwoh et al., "Transcription-based amplification system and detection of amplified human immunodeficiency virus type 1 with a bead-based sandwich hybridization format," *Proc. Natl. Acad. Sci. U.S.A.* 86:1173-1177, Feb. 1989.

Lage et al., "Whole Genome Analysis of Genetic Alterations in Small DNA Samples Using Hyperbranched Strand Displacement Amplification and Array-CGH," *Genome Research* 13:294-307, 2003.

Lanciotti et al., "Rapid Detection and Typing of Dengue Viruses from Clinical Samples by Using Reverse Transcriptase-Polymerase Chain Reaction," *J. Clin. Microbiol.* 30(3):545-551, Mar. 1992.

Leclerc et al., "Meager genetic variability of the human malaria agent Plasmodium vivax," *PNAS* 101(40):14455-14460, Oct. 5, 2004.

Lee et al., "Implementation of Force Differentiation in the Immunoassay," *Analytical Biochemistry* 287:261-271, 2000.

Leung et al., "Rapid antigen detection testing in diagnosing group A b-hemolytic streptococcal pharyngitis," *Expert. Rev. Mol. Diagn.* 6(5):761-766, 2006.

Lindegren et al., "Optimized Diagnosis of Acute Dengue Fever in Swedish Travelers by a Combination of Reverse Transcription-PCR and Immunoglobulin M Detection," *J. Clin. Microbiol.* 43(6):2850-2855, Jun. 2005.

Ling et al., "The Plasmodium falciparum clag9 gene encodes a rhoptry protein that is transferred to the host erythrocyte upon invasion," *Molecular Microbiology* 52(1):107-118, 2004.

Lundquist et al., "Human Recombinant Antibodies against Plasmodium falciparum Merozoite Surface Protein 3 Cloned from Peripheral Blood Leukocytes of Individuals with Immunity to Malaria Demonstrate Antiparasitic Properties," *Infect. Immun.* 74(6):3222-3231, Jun. 2006.

Luxton et al., "Use of External Magnetic Fields to Reduce Reaction Times in an Immunoassay Using Micrometer-Sized Paramagnetic Particles as Labels (Magnetoimmunoassay)," *Anal. Chem.* 76(6):1715-1719, Mar. 2004.

Mahony et al., "Chlamydia trachomatis confirmatory testing of PCR-positive genitourinary specimens using a second set of plasmid primers," *Molecular and Cellular Probes* 6:381-388, 1992.

Mahony et al., "Comparison of Plasmid- and Chromosome-Based Polymerase Chain Reaction Assays for Detecting Chlamydia trachomatis Nucleic Acids," *J. Clin. Microbiol.* 31(7):1753-1758, Jul. 1993.

Mahony et al., "Detection of Antichlamydial Immunoglobulin G and M Antibodies by Enzyme-Linked Immunosorbent Assay," *J. Clin. Microbiol.* 18(2):270-275, Aug. 1983.

Mahony et al., "Multiplex PCR for Detection of Chlamydia trachomatis and Neisseria gonorrhoeae in Genitourinary Specimens," *J. Clin. Microbiol.* 33(11):3049-3053, Nov. 1995.

Mahony, "Multiplex Polymerase Chain Reaction for the Diagnosis of Sexually Transmitted Diseases," *Clinics in Laboratory Medicine* 16(1):61-71, Mar. 1996.

Mayta et al., "Use of a reliable PCR assay for the detection of Neisseria gonorrhoeae in Peruvian patients," *Clinical Microbiology and Infection* 12(8):809-812, Aug. 2006.

Michon et al., "Naturally Acquired and Vaccine-Elicited Antibodies Block Erythrocyte Cytoadherence of the Plasmodium vivax Duffy Binding Protein," *Infect. Immun.* 68(6):3164-3171, Jun. 2000.

Migot-Nabias et al., "Immune Responses Against Plasmodium Falciparum Asexual Blood-Stage Antigens and Disease Susceptibility in Gabonese and Cameroonian Children," *Am. J. Trop. Med. Hyg.* 61(3):488-494, 1999.

Mitrani-Rosenbaum et al., "Simultaneous detection of three common sexually transmitted agents by polymerase chain reaction," *Am J Obstet Gynecol* 171(3):784-790, Sep. 1994.

Mohmmed et al., "Identification of karyopherin b as an immunogenic antigen of the malaria parasite using immune mice and human sera," *Parasite Immunology* 27:197-203, 2005.

Monis et al., "Nucleic acid amplification-based techniques for pathogen detection and identification," *Infection, Genetics and Evolution* 6:2-12, 2006.

Morré et al., "RNA Amplification by Nucleic Acid Sequence-Based Amplification with an Internal Standard Enables Reliable Detection of Chlamydia trachomatis in Cervical Scrapings and Urine Samples," *J. Clin. Microbiol.* 34(12):3108-3114, Dec. 1996.

Narum et al., "A novel Plasmodium falciparum erythrocyte binding protein-2 (EBP2/BAEBL) involved in erythrocyte receptor binding," *Molecular & Biochemical Parasitology* 119:159-168, 2002.

NCBI Database, GenBank Accession No. ACOL01000910, Jun. 9, 2009.

NCBI Database, GenBank Accession No. ACOL01004315, Jun. 9, 2009.

NCBI Database, GenBank Accession No. ACOL01004318, Jun. 9, 2009.

NCBI Database, GenBank Accession No. ACOL01004329, Jun. 9, 2009.

NCBI Database, GenBank Accession No. ACOL01004331, Jun. 9, 2009.

NCBI Database, GenBank Accession No. NP_473155, Jan. 3, 2007.

Nielsen et al., "Detection of Immunoglobulin G Antibodies to Cytomegalovirus Antigens by Antibody Capture Enzyme-Linked Immunosorbent Assay," *J. Clin. Microbiol.* 24(6):998-1003, Dec. 1986.

Notomi et al., "Loop-mediated isothermal amplification of DNA," *Nucleic Acids Research* 28(12):2-7, 2000.

Oeuvray et al., "Merozoite Surface Protein-3: A Malaria Protein Inducing Antibodies that Promote Plasmodium falciparum Killing by Cooperation With Blood Monocytes," *Blood* 84(5):1594-1602, Sep. 1994.

Ohara et al., "One-sided polymerase chain reaction: The amplification of cDNA," *Proc. Natl. Acad. Sci. U.S.A.* 86:5673-5677, Aug. 1989.

Ohta et al., "Enzyme-Linked Immunosorbent Assay of Influenza Specific IgA Antibody in Nasal Mucus," *Acta Paediatr. Jpn.* 33(5):617-622, Oct. 1991.

Østergaard et al., "A novel approach to the automation of clinical chemistry by controlled manipulation of magnetic particles," *Journal of Magnetism and Magnetic Materials* 194:156-162, 1999.

Ozoemena et al., "Comparative Evaluation of Measles Virus Specific TaqMan PCR and Conventional PCR Using Synthetic and Natural RNA Templates," *Journal of Medical Virology* 73:79-84, 2004.

(56) References Cited

OTHER PUBLICATIONS

Park et al., "Polymorphisms of p53, p21 and IRF-1 and cervical cancer susceptibility in Korean women," *Proceedings of the American Association of Cancer Research 44*, Second Edition, p. 1081, Jul. 2003.

Pfyffer et al., "Diagnostic Performance of Amplified Mycobacterium tuberculosis Direct Test with Cerebrospinal Fluid, Other Nonrespiratory, and Respiratory Specimens," *Journal of Clinical Microbiology* 34(4):834-841, Apr. 1996.

Pinder et al., "Immunoglobulin G Antibodies to Merozoite Surface Antigens Are Associated with Recovery from Choroquine-Resistant Plasmodium falciparum in Gambian Children," *Infect. Immun.* 74(5):2887-2893, May 2006.

Pingle et al., "Multiplexed Identification of Blood-Borne Bacterial Pathogens by Use of a Novel 16S rRNA Gene PCR-Ligase Detection Reaction-Capillary Electrophoresis Assay," *J. Clin. Microbiol.* 45(6):1927-1935, Jun. 2007.

Polley et al., "Vaccination for vivax malaria: targeting the invaders," *TRENDS in Parasitology* 20(3):99-102, Mar. 2004.

Porstmann et al., "Comparison of Chromogens for the Determination of Horseradish Peroxidase as a Marker in Enzyme Immunoassay," *J. Clin. Chem. Clin. Biochem.* 19(7):435-439, 1981.

Ranjan et al., "Mapping regions containing binding residues within functional domains of Plasmodium vivax and Plasmodium knowlesi erythrocyte-binding proteins," *PNAS* 96(24):14067-14072, Nov. 1999.

Rida et al., "Long-range transport of magnetic microbeads using simple planar coils placed in a uniform magnetostatic field," *Applied Physics Letters* 83(12):2396-2398, Sep. 2003.

Roosendaal et al., "Comparison of different primer sets for detection of Chlamydia trachomatis by the polymerase chain reaction," *J. Med. Microbiol.* 38:426-433, 1993.

Schachter et al., "Ligase Chain Reaction to Detect Chlamydia trachomatis Infection of the Cervix," *J. Clin. Microbiol.* 32(10):2540-2543, Oct. 1994.

Shi et al., "Fabrication and optimization of the multiplex PCR-based oligonucleotide microarray for detection of Neisseria gonorrhoeae, Chlamydia trachomatis and Ureaplasma urealyticum," *Journal of Microbiological Methods* 62:245-256, 2005.

Shi et al., "Natural Immune Response to the C-Terminal 19-Kilodalton Domain of Plasmodium falciparum Merozoite Surface Protein 1," *Infect. Immun.* 64(7):2716-2723, Jul. 1996.

Shu et al., "Development of Group- and Serotype-Specific One-Step SYBR Green I-Based Real-Time Reverse Transcription-PCR Assay for Dengue Virus," *J. Clin. Microbiol.* 41(6):2408-2416, Jun. 2003.

Snounou et al., "High sensitivity of detection of human malaria parasites by the use of nested polymerase chain reaction," *Molecular and Biochemical Parasitology* 61:315-320, 1993.

Soukchareun et al., "Use of Na-Fmoc-cysteine(S-thiobutyl) Derivatized Oligodeoxynucleotides for the Preparation of Oligodeoxynucleotide-Peptide Hybrid Molecules," *Bioconjugate Chem.* 9:466-475, 1998.

Staben et al., "Particle transport in Poiseuille flow in narrow channels," *International Journal of Multiphase Flow* 31:529-547, 2005.

Stetsenko et al., "Efficient Conjugation of Peptides to Oligonucleotides by 'Native Ligation'," *J. Org. Chem.* 65:4900-4908, 2000.

Sturm et al., "Vaginal tampons as specimen collection device for the molecular diagnosis of non-ulcerative sexually transmitted infections in antenatal clinic attendees," *International Journal of STD & AIDS* 15:94-98, Feb. 2004.

Tai et al., "Artificial Receptors in Serologic Tests for the Early Diagnosis of Dengue Virus Infection," *Clinical Chemistry* 52(8):1486-1491, 2006.

Tamim et al., "Cervicovaginal coinfections with human papillomavirus and chlamydia trachomatis," *Diagnostic Microbiology and Infectious Disease* 43:277-281, 2002.

TechNote 303, "Lateral Flow Tests," Bangs Laboratories, Inc., Rev. #002, Apr. 11, 2008, pp. 1-7.

Tongren et al., "Target Antigen, Age, and Duration of Antigen Exposure Independently Regulate Immunoglobulin G Subclass Switching in Malaria," *Infect. Immun.* 74(1):257-264, Jan. 2006.

Trenholme et al., "Antibody Reactivity to Linear Epitopes of Plasmodium Falciparum Cytoadherence-linked asexual gene 9 in asymptomatic children and adults from Papua New Guinea," *Am. J. Trop. Med. Hyg.* 72(6):708-713, 2005.

Tung et al., "Preparation and Applications of Peptide-Oligonucleotide Conjugates," *Bioconjugate Chem.* 11(5):605-618, Sep./Oct. 2000.

Tung et al., "Preparation of Oligonucleotide-Peptide Conjugates," *Bioconjugate Chem.* 2:464-465, 1991.

Unger et al., "Monolithic Microfabricated Valves and Pumps by Multilayer Soft Lithography," *Science* 288:113-116, Apr. 2000.

van Gemen et al., "Quantification of HIV-1 RNA in plasma using NASBAä during HIV-1 primary infection," *Journal of Virological Methods* 43:177-188, 1993.

Vinayagamoorthy et al., "Nucleotide Sequence-Based Multitarget Identification," *J. Clin. Microbiol.* 41(7):3284-3292, Jul. 2003.

Vivès et al., "Selective Coupling of a Highly Basic Peptide to an Oligonucleotide," *Tetrahedron Letters* 38(7):1183-1186, 1997.

Walker et al., "Strand displacement amplification—an isothermal, in vitro DNA amplification technique," *Nucleic Acids Research* 20(7):1691-1696, 1992.

Walker, "Empirical Aspects of Strand Displacement Amplification," *PCR Methods and Applications* 3:1-6, 1993.

Wang et al., "Molecular engineering of DNA:molecular beacons," *Angew Chem Int Ed Engl* 48(5):856-870, 2009.

Watson et al., Molecular Biology of the Gene, 4th Ed., Benjamin Cummings Publishing Company, Menlo Park, California, Jan. 1987.

Weinstock et al., "Sexually Transmitted Diseases Among American Youth: Incidence and Prevalence Estimates, 2000," *Perspectives on Sexual and Reproductive Heath* 36(1):6-10, Jan./Feb. 2004.

Whiley et al., "Comparison of three in-house multiplex PCR assays for the detection of Neisseria gonorrhoeae and Chlamydia trachomatis using real-time and conventional detection methodologies," *Pathology* 37(5):364-370, Oct. 2005.

Witkin et al., "Detection of Chlamydia trachomatis by the polymerase chain reaction in the cervices of women with acute salpingitis," *Am J Obstet Gynecol* 168(5):1438-1442, May 1993.

Woehlbier et al., "Analysis of Antibodies Directed against Merozoite Surface Protein 1 of the Human Malaria Parasite Plasmodium falciparum," *Infect. Immun.* 74(2):1313-1322, Feb. 2006.

Wu et al., "The Ligation Amplification Reaction (LAR)—Amplification of Specific DNA Sequences Using Sequential Rounds of Template-Dependent Ligation," *Genomics* 4:560-569, 1989.

Yogi et al., "Clinical Evaluation of the Bladder Tumor Marker "TU-MARK-BTA"," *Hinyokika Kiyo* 37(4):335-339, Apr. 1991.

Cady, "Quantum dot Molecular Beacons for DNA Detection," in *Micro and Nano Technologies in Bioanalysis,* Lee et al., (eds.), Humana Press, 2009, pp. 367-379.

Cissell et al., "Resonance energy transfer methods of RNA detection," *Analytical and Bioanalytical Chemistry* 393(1):125-135, 2009.

Freund et al., (eds.), "Film buckling, bulging, and peeling," in *Thin Film Materials: Stress, Defect Formation and Surface Evolution,* Cambridge, UK, The University of Cambridge, 2003, pp. 312-386.

Frohman, "Race: Rapid Amplification of cDNA Ends," in *PCR Protocols: A Guide to Methods and Applications,* Innis et al., (eds.), New York, Academic Press, Inc., 1990, pp. 28-38.

Krasnoperov et al., "Luminescent Probes for Ultrasensitive Detection of Nucleic Acids," *Bioconjug. Chem.* 21(2):319-327, Feb. 2010.

Li et al., "Molecular Beacons: an optimal multifunctional biological probe," *Biochemical and Biophysical Research Communications* 373:457-461, 2008.

Lofquist et al., "Device for Preparation and Analysis of Nucleic Acids," U.S. Appl. No. 14/889,374, filed Nov. 5, 2015, 51 pages.

Van Lintel, "A Piezoelectric Micropump Based on Micromachining of Silicon," *Sensors and Actuators* 15:153-167, 1988.

(56) References Cited

OTHER PUBLICATIONS

Khanna et al., "Transformation of *Bacillus subtilis* by DNA Bound on Montmorillonite and Effect of DNase on the Transforming Ability of Bound DNA," *Applied and Environmental Microbiology* 58(6):1930-1939, Jun. 1992.

Huft et al., "Fabrication of High-Quality Microfluidic Solid-Phase Chromatography Columns," *Anal. Chem.* 85:1797-1802, 2013.

Zhang et al., "Synthesis of clay minerals," *Applied Clay Science* 50:1-11, 2010.

\* cited by examiner

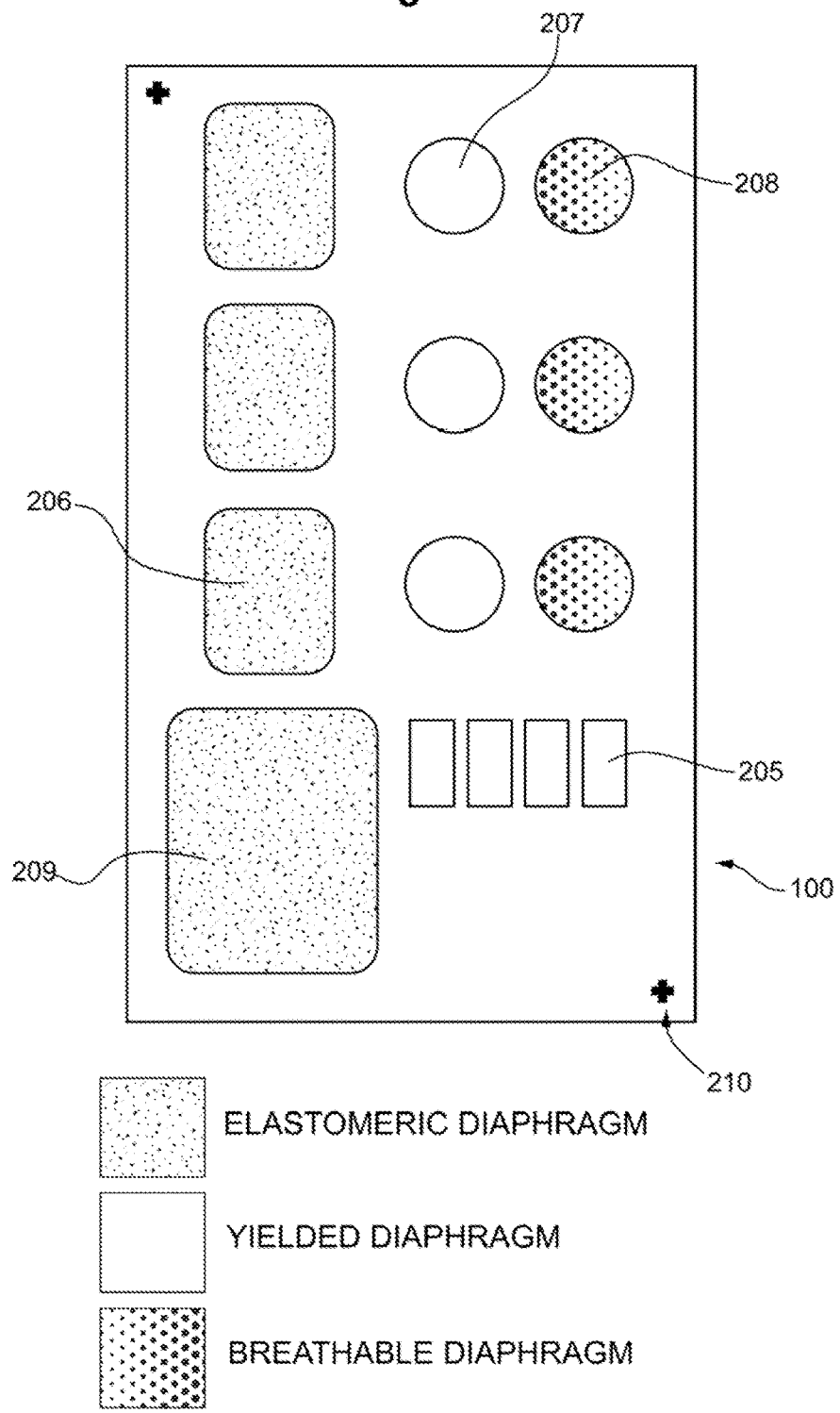

Fig. 3

MANUFACTURING PROCESS FOR ASSEMBLING MIXED DIAPHRAGM MEMBERS BY EDGE-BONDED LASER DECOUPAGE

- FORMING A FIRST PLANAR MEMBER HAVING A FIRST FACE ON WHICH HYDRAULIC CAVITY FEATURES DEFINING A HYDRAULIC CIRCUIT ARE FORMED;

- FORMING A SECOND PLANAR MEMBER HAVING A FIRST FACE ON WHICH PNEUMATIC CAVITY FEATURES DEFINING A PNEUMATIC CIRCUIT ARE FORMED;

- CONTACTING SAID PNEUMATIC FACE WITH A FIRST FILM AND CUTTINGLY WELDING AT LEAST ONE DIAPHRAGM MEMBER THEREFROM, WHEREIN SAID DIAPHRAGM MEMBER IS DIMENSIONED TO COVER A FIRST PNEUMATIC CAVITY AND FORM AN APRON THEREAROUND;

- CONTACTING SAID PNEUMATIC FACE WITH A SECOND FILM AND CUTTINGLY WELDING AT LEAST ONE DIAPHRAGM MEMBER THEREFROM, WHEREIN SAID DIAPHRAGM MEMBER IS DIMENSIONED TO COVER A 2nd PNEUMATIC CAVITY AND FORM AN APRON THEREAROUND; and

- BONDING OR FUSING SAID FIRST FACE OF SAID FIRST PLATE MEMBER TO SAID FIRST FACE OF SAID SECOND PLATE MEMBER, THEREBY SEALINGLY PARTITIONING SAID HYDRAULIC CAVITY FEATURES FROM SAID PNEUMATIC CAVITY FEATURES AND FORMING A PNEUMOHYDRAULIC CIRCUIT ELEMENT SELECTED FROM VALVE, PUMP, VENT, FILTER, FLUID RESERVOIR AND WASTE CHAMBER; AND,

- WHEREIN SAID FIRST FILM AND SAID SECOND FILM ARE COMPOSED OF DISSIMILAR MATERIALS

Fig. 5G
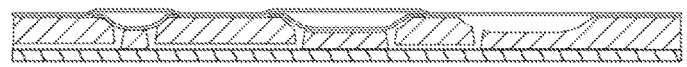
Fig. 5H
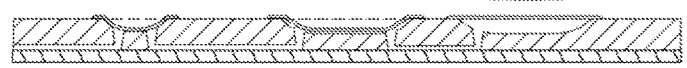
Fig. 5I
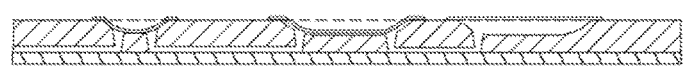
Fig. 5J
Fig. 5K
Fig. 5L

MANUFACTURING PROCESS FOR ASSEMBLING DIAPHRAGM MEMBERS
BY EDGE-BONDED DECOUPAGE

*Fig. 14A*
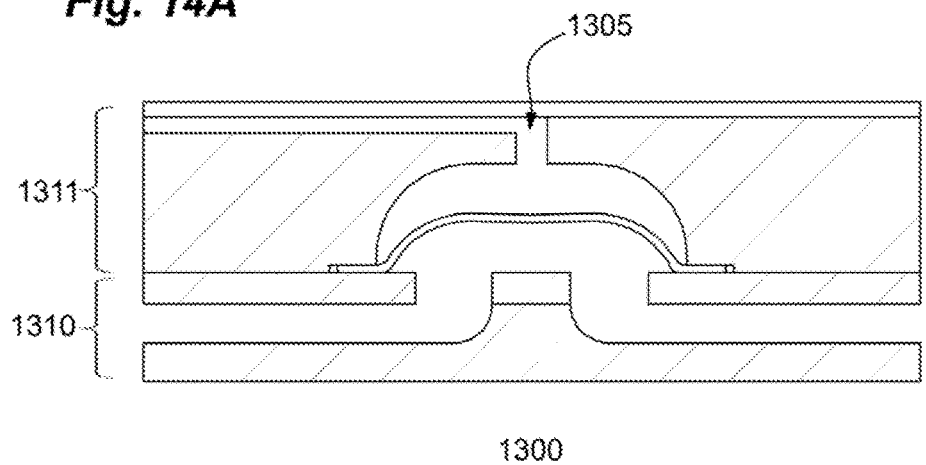
1300
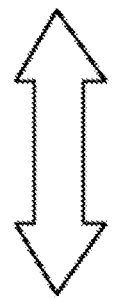
*Fig. 14B*
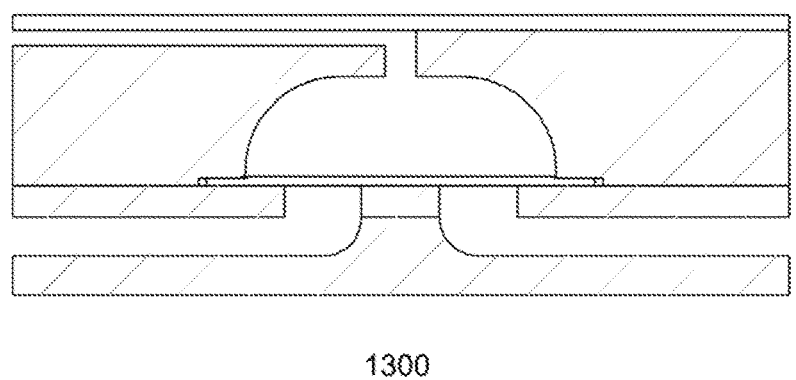
1300

FLUIDIC CIRCUITS AND RELATED MANUFACTURING METHODS

BACKGROUND

Technical Field

The present invention generally relates to fluidic devices, such as microfluidic devices, and methods for manufacture and use of the same.

Description of the Related Art

Fluidic microcircuits are known in the art, and include mechanical systems such as piston driven devices, electrohydraulic systems such as electrokinetic pump and valve devices, and pneumohydraulic systems. Of these, those systems with pneumatic actuators and control surfaces have proven most practical in controlling microscale fluid flows.

One class of fluidic devices having a pneumatic interface is manufactured by Micronics, Inc. (Redmond, Wash.). Control of fluid flow in microfluidic channels is achieved with a MICROFLOW® system pneumatic controller, which operates millimeter-sized valves in a plastic cartridge according to programmable valve logic. Miniature diaphragms separate the pneumatic side and the hydraulic side of the cartridges; i.e., the valve diaphragms are interface elements for converting pneumatic control pulses into starting and stopping fluid flow. Cartridges are formed by building up laminations, layer by layer, with channels and chambers sealed between capping overlayers. All the diaphragms are formed of a single layer. In this way, complex fluidic circuits are formed. Pneumatic and hydraulic channels and chambers are formed such that the pneumatic workings and the hydraulic workings of the cartridge are separated by an elastomeric diaphragm layer. Diaphragms formed of polyurethane and PDMS have been favorites for this method. An unsolved problem is the ability to manufacture circuits in which the diaphragm material can be varied (e.g., breathable, chemically resistant, rupturable, elastomeric, inelastic, and so forth) according to the type or subtype of circuit element.

A second unsolved problem relates to the manufacturability of microcircuits having millimeter and sub-millimeter footprints. Miniaturization has proven a benefit, favoring development of devices having a higher density of circuit components per unit area, but valves and diaphragms at a millimeter or sub-millimeter scale have been difficult to realize by current production methods.

Micropumps

Miniature diaphragm pump elements, for example, are needed to achieve fullest benefit of fluidic microcircuitry technologies, which find numerous applications such as in diagnostics and in life sciences more generally. Diaphragm-driven pumps are advantageous because of their sanitary features, including the absence of mechanical seals and lubricant.

Although miniature pumps were generically disclosed by Wilding (for example in U.S. Pat. Nos. 5,304,487 and 5,498,392), the disclosures themselves were not sufficient to fully enable fluidic microcircuitry pumps and valves. Cited by Wilding was Van Lintel [1988, "A Piezoelectric Micropump Based on Micromachining of Silicon," Sensors and Actuators, 15:153-167], which relates to pumps microfabricated from silicon. Silicon-based microelectromechanical (MEMS) structures are not generally compatible with modern plastic devices.

There has been greater interest in elastomeric diaphragm materials because of the higher compression ratio and larger displacement volume, which offers the advantage of self-priming in fluidic operations. For example, polydimethylsiloxane (PDMS) and silicones generally readily form thin sheets or articulated blocks and are used as diaphragm materials. Latex rubber and amorphous polyurethanes have also been used. Elastomeric materials that obey Hooke's law have the advantage that the diaphragm returns to its original shape in the relaxed state, but this is advantageous only for some applications, and can be associated with lack of chemical resistance.

Microvalves

Representative art related to valves includes U.S. Pat. No. 4,304,257 (the '257 valve), in which a soft, resilient, polyurethane sheet is clamped over flow channels formed in a hard acrylic body. A fluid path between two discontinuous fluid channels is opened and closed by actuating pistons which mechanically flex a part of the sheet. A tenting action on the sheet is associated with valve opening; valve closing is associated with spring return of the resilient sheet to a closed position. The sheet is flexed mechanically between the two positions by a solenoid-operated rod having an embedded attachment to the sheet over the valve seat, such that the sheet contacts the seat when closed and the sheet is pulled into an aperture overlying the valve seat to open the valve.

According to the teachings of U.S. Pat. No. 4,848,722, the '257 valve has several disadvantages. In addition to delicacy of mechanical solenoid operation and need for fine adjustment, the membrane is subjected to great stresses with the risk of permanent stretch (i.e., permanent deformation or pinching past its yield point). By virtue of the concave contact surface for the membrane, the sealing area is maximized, but disadvantageously, a non-zero and significant volume of the valve cavity must be filled before fluid begins to flow.

In expired U.S. Pat. No. 4,848,722 (the '722 valve), a pressure or vacuum source is used to urge a flexible sheet such as biaxially oriented polyethylene terephthalate (boPET) into a stop-flow position in which apertures formed by the channels (3,4) in the valve seat are closed and an open position in which the apertures are fluidly confluent. The step land (FIG. 9: 62) of the valve seat is contacted by sheet (8) when the valve is closed. The sheet is glued to the pneumatic side of the valve.

U.S. Pat. No. 4,869,282 describes a micromachined valve having a diaphragm layer sandwiched between two rigid layers forming the valve cavity. The diaphragm layer is formed of polyimide, which is deflected by an applied pneumatic pressure in a control circuit to close the valve. Diaphragm motion is limited to avoid overstressing the polyimide layer.

Expired U.S. Pat. No. 5,660,370 (the '370 valve) describes a valve (FIG. 1: 1) having flexible diaphragm (2) and flat valve seat formed of a rigid layer in which two holes are formed, each hole defining an opening to a fluidic channel (3,4) in an underlying layer, where the holes are separated by a valve sill. The diaphragm is made of polyurethane or silicone. The valve (5) is opened by pneumatically exercising the diaphragm. To avoid the tendency of the sheet to become stressed beyond its yield point, a flat valve seat is used to minimize the required range of diaphragm motion. This also reduces the deadspace volume of the valve.

A similar structure is seen in U.S. Pat. No. 5,932,799 to YSI Inc., which teaches a fluidic microcircuitry analyzer having a plurality of polyimide layers, preferably KAP- TON® film, directly bonded together without adhesives and a flexible pneumatically actuated diaphragm member for controlling fluid flow.

WO Publ. No. 2002/081934 to Micronics, Inc., published Oct. 17, 2002, describes a laminated valve having an elastomeric diaphragm. These valves, which were termed "peanut valves", admit fluid across the valve sill under negative pressure, and are closed when positively pressurized. Advantageously, the valve cavity is formed with a contoured waist to minimize deadspace volume.

U.S. Pat. No. 7,445,926 to Mathies describes a laminate with a flexible diaphragm layer sandwiched between hard substrates. Pneumatic channels and fluid channels are formed on opposite sides of the diaphragm layer (cf., FIG. 1 of the reference), so that the diaphragm is the active valve member. The diaphragm material disclosed is a 254 micrometer PDMS membrane. The valve body is typically a solid such as glass.

US Pat. Appl. Nos. 2006/0275852 and 2011/0207621 to Montagu describe a fluidic cartridge for biological assays. The cartridge includes a molded body defining flow passages. A latex diaphragm and a canned diaphragm pump are shown (cf., FIG. 5 of the reference). The "rolling elastic diaphragm pump" member (3) is inserted into the cartridge as a preformed subassembly and is commercially available (Thomas Pumps, Model 1101 miniature compressor, Sheboygan, Wis. 53081). Valves are mechanically actuated using a stepper motor. Thus the valves have the disadvantage of requiring sensitive and meticulous adjustment for proper operation.

Other elastomeric valve and pump constructs are known. Examples of silicone valve construction include U.S. Pat. Nos. 5,443,890, 6,793,753, 6,951,632 and 8,104,514, all of which illustrate soft lithographic processes (cf., U.S. Pat. Nos. 7,695,683 and 8,104,497) for forming valves and pumps. PDMS may be used to form diaphragms and pump bodies. Latex rubber and amorphous polyurethanes have also been used as diaphragm materials, but chemical resistance may not be sufficient for some applications.

While not limiting, examples of diaphragm materials having properties that have not been exploited for pneumohydraulic circuits include members that are gas permeable and liquid impermeable after wetting. Diaphragm members that are elastic and breathable are not known in the field of fluidic microcircuitry technology. Diaphragm members having solvent resistance and capable of being shaped into form-in-place diaphragms are not known. Other potential diaphragm materials have not been considered because means for independently selecting a diaphragm material for each class of fluidic element (such as valve, pump, reservoir, and so forth) are not known.

Advantageously, a gas-permeable diaphragm that retains its breathability after wetting would permit use of diaphragms in dead-ended fluidic circuits. Advantageously, a solvent-resistant diaphragm that yields to form a pre-shaped diaphragm member has application in valves used for pumping suspensions of particulates, and for replacing polyurethane diaphragms which leak when exposed to caustics, chaeotropes, or solvents, thus permitting use of solvents such as ethanol, formamide and dimethylsulfoxide for reducing temperature requirements during PCR, while not limited thereto.

Materials suited for one such application may be unsuited for another. As a first example, valve diaphragms may not be workable if fabricated from a microporous gas-permeable film, whereas vents require microporosity. Similarly, diaphragms requiring elasticity may not be readily substituted by diaphragms having a low yield point. Optimization of materials for particular classes of fluidic elements offers an advantage only if each class of fluidic elements can be optimized independently. Selected embodiments of the inventions cannot be realized without methods of manufacture which selectably incorporate an assortment or mixed palette of advanced diaphragm materials into the pump, valve, filter, vent and cuvette membranes of individual cartridges, where each class of fluidic elements is represented by a distinct and dissimilar diaphragm material. The various diaphragm materials are generally made of thin films.

The engineering of both valve and pump diaphragms can benefit from a manufacturing method that permits assembly of fluidic devices using thin films selectable from a list of materials. Conventional glue in place methods are not well suited to mass production and have raised technical barriers to further miniaturization and increased density of circuit elements. Given the unique advantages of the combinations disclosed herein, a process is needed to manufacture a fluidic circuit in which each diaphragm member of the fluidic circuit is independently selected from a plurality of available materials according the functional requirements of each individual circuit element. Currently available methods do not permit mass production of devices comprised of multiple diaphragm materials on a single cartridge at the manufacturing scale needed to satisfy the expected market growth in use of fluidic devices, such as for diagnostic assays.

While progress has been made, there is a need in the art for improved fluidic devices, such as microfluidic devices, The present invention provides this and related advantages.

BRIEF SUMMARY

Fluidic devices having an assorted plurality of pneumohydraulic diaphragms are disclosed, such that the diaphragm members are not formed as a single sheet, but are instead each deposited individually so that the material of the diaphragm can be varied according to the kind of circuit element being formed. Each cartridge contains circuit elements (such as valve, pump, vent, filter) that are grouped as subsets and combinations having different diaphragm materials. Also disclosed is a method for manufacture of these systems by a diaphragm printing process that can be described as "edge-bonded decoupage", with adaptations for high-throughput manufacture.

Diaphragms may further be subjected to a "form in place" process by stretching the diaphragm film past its yield point. After relaxation, these diaphragms retain the shape of the cavity in which they are stretched. This process occurs after initial assembly of the fluidic system and closure of the housing, and advantageously also serves as a quality control step for identifying product having continuity or leak defects. Overstretched diaphragms may also be formed mechanically, such as by a rolling or a pressing process. Pre-stretched diaphragms have improved response time, increased stroke volume consistency, decreased flow resistance, and valves made in this way have smaller internal volumes and a smaller footprint.

As an introduction, several embodiments are illustrated by way of examples. In each embodiment, a plurality of assorted diaphragm subtypes are assembled in a device, each diaphragm subtype having been formed of a particular material having a unique property (such as elasticity, inelasticity, breathability, impermeability, chemical resistance, rupture sensitivity, and so forth) of value in a fluidic circuit, where any one diaphragm subtype is not suited for all the desired fluidic circuit elements. These subcombinations are illustrative of the general concept of a fluidic circuit having an assortment of specialized diaphragms which are "printed in place", and are not intended to be limiting, i.e., the illustrated subcombinations may be formed into larger combinations, and other subcombinations and combinations are readily achieved by practicing the principles behind these teachings.

Using the processes of the invention, subtypes of diaphragms having properties uniquely suited to particular fluidic or pneumatic functions are readily incorporated alongside other subsets of diaphragms having dissimilar properties. It will be readily apparent that the full list of possible subcombinations of circuit elements having individualized diaphragm materials would be extensive, and that the principles of the invention are apparent from the disclosure herein, while not limited thereby.

Fluidic Cartridges/Fluidic Circuits

In another embodiment, fluidic cartridges having 2, 3, 4, or more layers may be formed around fluidic circuits containing a plurality of assorted diaphragm materials that have been formed into functional units. Fluidic cartridges of the invention may be formed having two molded substrate layers and one or two capping layers for example, while not limited thereto. Unique three layer and four layer fluidic cartridges are formed by this process, dramatically simplifying manufacture. Fluidic cartridges having 4 layers are particularly preferred for reasons as will be described below.

Preferredly, the cartridges comprise a first molded piece which houses the pneumatic works and a second molded piece which houses the fluidic works. Diaphragm members are inserted between the two molded pieces in proper registration to separate the pneumatics from the fluidics where they intersect and to form valves, pumps, vents, waste receptacles, reagent reservoirs and cuvettes, for example. In this way, structures are formed such that action of a pneumatic pulse on a diaphragm results in motion or arrest of a fluid on the other side of the diaphragm. Diaphragms thus have a fluid side and a pneumatic side. Capping layers are used to seal additional pneumatic or fluidic features that would otherwise be on the exposed outer surfaces of the device.

Decoupage Process Description

In a production process of the invention, each diaphragm is cut from a film layer as an island on a substrate having a pneumatic cavity, the cutting process forming a weld between the film layer and the substrate at least so that excess material surrounding the diaphragm cutouts is removed. In a second step, a second substrate having a hydraulic cavity is fused or bonded to the first substrate so that an "apron" around each diaphragm member is compressed between the first and second substrates. The apron is a margin of the diaphragm member that is cut oversize to permit a compression or fusion seal around the edges of the diaphragm between the two substrate layers while allowing the internal web of the diaphragm to be unbonded. The resulting diaphragm has a range of motion defined by the size of the cavity in which it is encapsulated.

By placing diaphragms between pneumatic cavities in the first substrate and hydraulic cavities in the second substrate, operable pneumohydraulic microcircuits are constructed. The paired cavities may function as valves, pumps, vents, filters, extractors, waste receptacles, reagent reservoirs, and cuvettes.

Sheets of diaphragm materials may be welded or tacked to a polymeric substrate using laser decoupage or hot nip roller decoupage, although laser decoupage has the advantage that a laser can be guided over the workpiece to make welds according to a programmable design.

Advantageously, the cutting process is performed cooperatively with an air knife or electrostatic roller so as to remove excess and unbonded diaphragm material. This ensures that discrete diaphragms each having unique properties may be printed at high density.

In a preferred embodiment of the invention, diaphragm materials are supplied as films from a roll or sheet and contacted with a first rigid or semi-rigid substrate so that a cutting laser may be used to tack or fuse in place individual diaphragm members cut from the film. Excess material is removed and a first subset of diaphragms is printed onto the substrate in this way in registration with underlying features (i.e., cavities) in the substrate. A second round of diaphragm printing results in a substrate having a plurality of diaphragms, a subset formed of a first material and a subset formed of a second material, where the materials are compositionally distinct. Additional diaphragms are printed in place if desired.

In some embodiments, dehydrated reagents may be prepositioned in the cartridge by printing spots on the fluidic face before the placement of the second substrate. The substrates may also be modified with surface treatments, textures, or optical coatings before assembly of the cartridge. A second substrate piece is then contacted on its fluidic face with the first so that the diaphragms are sandwiched between the two body parts and the conjoining faces are fused or bonded.

In a third step, capping layers are applied to the outside surfaces of the body parts if needed, sealing any channels or chambers formed in those outside surfaces. Any vents or sample inlet holes are generally precut into the capping layers, which are fed into the process for example from a roll of stamped or precut appliqués, often with an intermediate glue layer or ACA layer where solvent, thermal, molecular, laser or ultrasonic bonding between the pieces is not practical.

These and other features of the inventive products and processes will be more fully made apparent by the detailed description which follows, the claims and accompanying drawing figures herewith, the entirety of which, taken together, form the specification of the invention.

BRIEF DESCRIPTION OF THE SEVERAL VIEWS OF THE DRAWINGS

FIG. 2 is a schematic representation showing the use of mixed diaphragm materials to form various classes of fluidic elements.

FIG. 3 is a block diagram describing a process for manufacturing a fluidic cartridge having a plurality of circuit element subtypes containing pneumatically operated diaphragm members, where the diaphragm materials are selected independently according to each circuit element or subtype.

FIGS. 5A through 5L are views of steps in a process of making a cartridge having four body layers using laser decoupage.

FIGS. 14A and 14B are cross-sectional views of a microvalve structure, showing "ON" and an "OFF" pneumatic control of the valve diaphragm. The valve diaphragm member is may be formed in situ by a process of edge-bonded decoupage from an elastomer, a microporous polymer, a stretchable polymer, and optionally may be followed by a process of inelastic deformation, for example, according to the design of the fluidic circuit.

DETAILED DESCRIPTION

Figure 1:
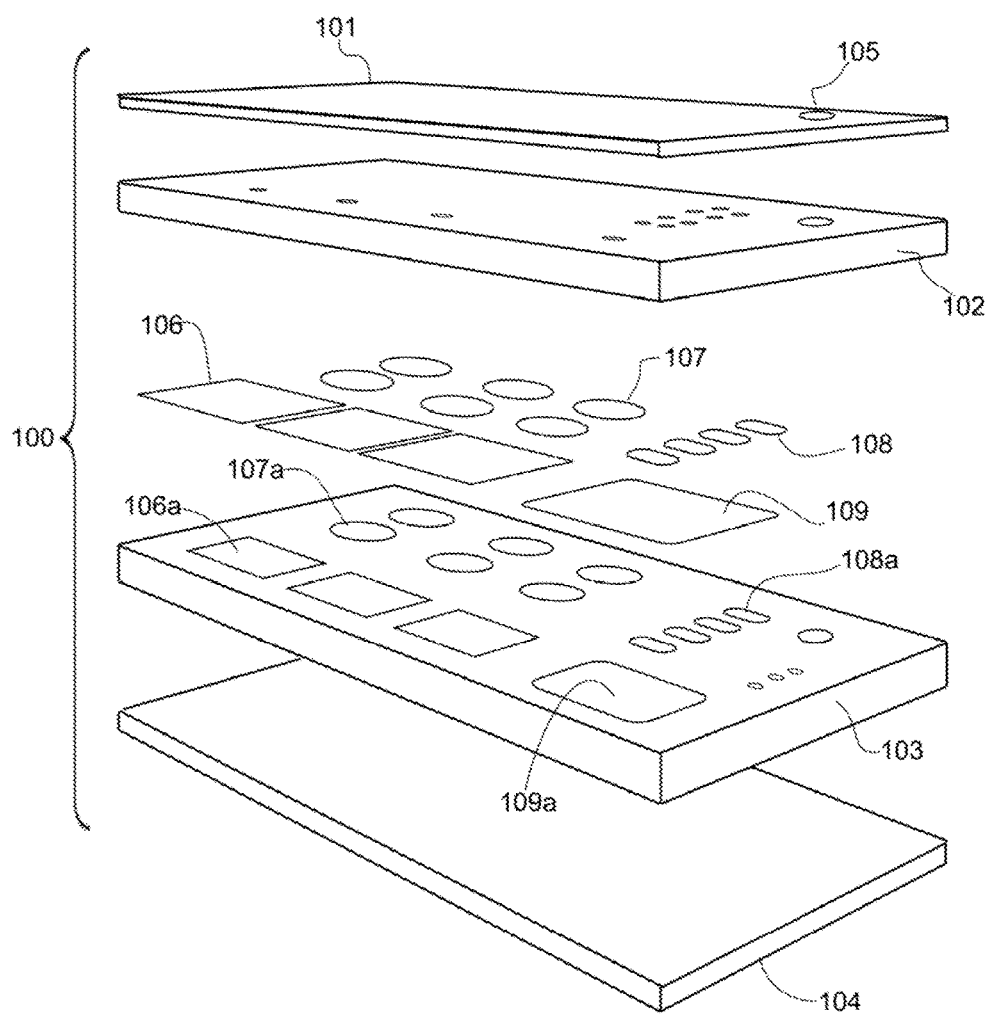
FIG. 1 is an exploded schematic view of a cartridge body having a plurality of diaphragms sandwiched between body layers.

The foregoing and other objectives, features, and advantages of the invention will be more readily understood upon consideration of the following detailed description of the invention, taken in conjunction with the accompanying drawings, in which preferred embodiments of the invention are illustrated by way of example. It is to be expressly understood, however, that the drawings are for illustration and description only and are not intended as a definition of the limits of the invention. The various features of novelty that characterize the invention are pointed out with particularity in the claims annexed to and forming part of this disclosure. The invention does not necessarily reside in any one of these features taken alone, but rather in the particular combination of all of its structures for the functions specified.

Certain terms throughout the following description are used to refer to particular features, steps or components, and are used as terms of description and not of limitation. As one skilled in the art will appreciate, different persons may refer to the same feature, step or component by different names. Components, steps or features that differ in name but not in function or action are considered equivalent and not distinguishable, and may be substituted herein without departure from the invention. Certain meanings are defined here as intended by the inventors, i.e. they are intrinsic meanings Other words and phrases used here take their meaning as consistent with usage as would be apparent to one skilled in the relevant arts.

Definitions:

"Substrate" refers to a body layer or member having a generally planar face upon which cavities forming chambers and channels are embossed or molded.

"Microfluidic"—by convention, refers to fluidic features having at least one critical dimension that is less than 500 micrometers. The narrowness of the critical dimension results in fundamental changes in the rules governing fluid flow. The fluidic microcircuitry flow regime is characterized by Poiseuille or "laminar" flow.

"Hydraulic works" of a device: includes the network or networks of intercommunicating channels and chambers that are intended to be wetted by sample or liquid reagents in the course of an assay. The hydraulic networks are configured with fluidic subcircuits for performing the steps of an assay.

"Pneumatic works" of a device: includes the network or networks of pneumatically actuated valves, pumps and diaphragms and interconnecting circuitry and manifolds that are useful for powering and controlling the hydraulics of the device. The pneumatic works of the cartridge device interface with positive and negative pressure sources on the host instrument and with valves, diaphragms, pumps and other pneumatically actuated elements that control and drive liquids in the hydraulic network.

While it may be said that the pneumatic works of the device are preferably operated with a gas such as air or nitrogen, it is also conceived that equivalent "pneumatic" circuits may be operated with a fluid more generally, where fluid is selected from a gas or a liquid, including liquids such as silicone oils, vegetable oils, fluorocarbon liquids, and the like. Thus in one variant of the invention, the pneumatic works are operated with a "fluid" having the characteristics of a liquid and the operation of the device is otherwise equivalent, as would readily be understood by one skilled in the art.

"Fluidic works" of a device: include the hydraulic works formed of a network or networks of internal channels and chambers wetted in the course of the assay and the pneumatic works formed of control and pump driving circuits powered by positive and negative pressure sources derived from a host instrument via a pneumatic interface.

The fluidic works may be divided into fluidic subcircuits, where each subcircuit comprises channels and chambers for performing a particular function on a liquid sample or reagent. The fluidic subcircuits may be organized into serial subcircuits (such as for extraction, amplification and detection of a nucleic acid target or targets) and parallel subcircuits and networks such as for simultaneous assay for multiple targets on a single sample by splitting the sample. "Microscale" and "fluidic" refer to devices having millimeter or submillimeter features.

"Stress" is the internal or restoring force per unit area associated with a strain and has units of Pascals or megaPascals.

"Strain" is a ratio $\Delta L/L_0$ of the change in length divided by the original length in response to an externally applied stress, and is unitless; it is often given in percent.

"Yield point" is the point on a stress-strain curve where the curve deflects or levels off and plastic deformation commences, and thus corresponds to the "elastic limit" of the material. Prior to the yield point, the material elastically return to its original shape when the applied stress is removed. Once the yield point is passed, some fraction of the deformation will be permanent and non-reversible.

"Yield Strength" and "yield point" are measured by standard techniques for reproducibility, such as described in ASTM Standard Test Method D882-10 (the "882 test method"). For consistency, generally a 1 mil film is a preferred substrate. Yield strength is an indication of the maximum stress that can be developed in a material without causing irreversible deformation. Yield point is an indication of the maximum strain that can be developed in a material without causing irreversible deformation. For practical reasons, the measurements of yield strength, strain, elastic limit and elastic modulus are defined experimentally from a stress-strain diagram.

Offset yield strength is the stress read from the diagram at the intersection of an offset line (drawn parallel to the initial slope of the stress-strain curve through the elastic deformation range) and the stress-strain curve, where the offset line is offset by a selected value. Offsets for plastics are conventionally taken as 2%. Optionally, yield is sometimes shown as a range, for example in the case of co-laminated films.

"Elasticity" refers to the ability of a material to return to its original shape when load causing deformation is removed. Elasticity is the ability to store and release energy with a spring-like sample response generally as described by Hook's law of elasticity. If the strain increases linearly with increasing applied stress, the material is purely elastic, however in some materials, such as materials displaying visco-elastic properties, the stress-strain relation is not linear and the sample response is strongly dependent on time and rate of load application.

"Elastic modulus" (E), also termed "Elastic Modulus", is a slope measured in the elastic deformation region of the stress-strain curve, where strain is fully reversible. "Elastic Modulus" is the initial slope measured in the stress-strain curve and is an indication of the stiffness of the material. Elastic Modulus is a constant within the range of stretch or deformation that is fully reversible, and is thus equivalent to the spring constant of Hooke's Law.

"Permanent Deformation" or "inelastic deformation", is an increase in length dimension, expressed as a percentage of the original length dimension, by which material fails to return to its original length after being subjected to an elongation stress. When subjected to a stress greater than the yield strength or elastic limit of the film, permanent deformations of thin films may occur. For example, when a thin film diaphragm having a web span length from one side to another of a cavity or frame is stretched by a pressure and then collapsed back to a relaxed state, the web span length may be permanently elongated according to the amount of overstretch that the diaphragm was subjected to in excess of its yield point. "Overstretch" simply indicates that the material has been stretched past its yield point.

"Toughness" of a material is the ability of a material to absorb energy and plastically deform without fracturing or rupturing, and can be related to the total area under the stress-strain curve up to a break point according to the integral $$K=\int_0^{\epsilon_f}\sigma d\epsilon$$

where $\epsilon$ is strain, $\epsilon_f$ is the strain on failure, and $\sigma$ is stress. The units of K are of energy per unit volume. For purposes of the invention, toughness is particularly indicative of the capacity of a material to undergo a strain of up to 50% by length and to be permanently deformed thereby. This property is desirable for the manufacture of pneumatic elements by a form-in-place process as described herein.

A comparison of the relative magnitudes of the yield strength, ultimate tensile strength and percent elongation of different material can also give a good indication of their relative toughness.

"Top", "bottom", "up", "down", "upper", "lower", "above", "below", "upward", "downward", "superior to", "floor", "roof", "convex", "concave", and so forth, are indications of relative position and not absolute position or viewpoint: when reference is made to a specific frame of reference, such as the "ground plane" which is taken as orthogonal to an intersecting plumb line.

A "method" as disclosed herein refers one or more steps or actions for achieving the described end. Unless a specific order of steps or actions is required for proper operation of the embodiment, the order and/or use of specific steps and/or actions may be modified without departing from the scope of the present invention.

"Conventional"—refers to a term or method designating that which is known and commonly understood in the technology to which this invention relates.

FIG. 1 is an exploded view of an illustrative cartridge 100 of the invention. The cartridge is formed of four layers, from top to bottom a first capping layer 101, a pneumatic molded plate layer 102, a fluidic (hydraulic) molded plate layer, and a second capping layer 103. Between the two molded plates are multiple diaphragm subtypes (105, 106, 107, 108, 109); the diaphragms are formed into subtypes according to their composition and function. Each class of fluidic circuit elements (such as pumps, valves, vents, and so forth) may be formed of a particular material having particular functional properties. Corresponding cavities (106a, 107a, and 108a) in the hydraulic plate layer are shown as an indication of how the diaphragm structures are integrated into functional circuit elements. Element 108, for example, can represent a bank of valves forming a valve tree. Element 109 may represent a waste chamber, and so forth. A sample inlet 105 is representative of other fluidic features, although the details of fluidic channels, vias, and connections in the body are not shown.

The cartridge contains hydraulic works and pneumatic works, including microscale channels, cavities and chambers. Sample and reagent liquids are conveyed in a hydraulic network of the cartridge or card; fluid flow is controlled and driven by a pneumatic network that interfaces with the hydraulics at diaphragms spanning selected junctions, channels and chambers. Typically, the body of the cartridge or card is made of a flexible plastic and may be formed by lamination, molding or a combination thereof. Body plastics may include, but are not limited to, polycarbonate, polyethylene terephthalate, cyclic polyolefins, acrylates, methacrylates, polystyrene, polyimide, polysilicone, polypropylene, high density polyethylene, low density polyethylene, graft and block copolymers, and composites thereof. A preferred cartridge is made from rollstock and includes dry reagents printed thereon. Other such cartridges may include molded body elements.

A cartridge 100 is illustrated schematically in FIG. 2, where various classes of circuit elements are formed, and each class of circuit elements is formed with a distinct and dissimilar diaphragm material (see legend). Five classes of circuit elements are illustrated (205, 206, 207, 208, 209) as might represent valves 205, reagent reservoirs 206, a first pump type 207, a second pump type 208, a waste reservoir 209, and so forth.

In one embodiment, active pump diaphragms may be formed of a polymer having a yield point such that inelastic stretching occurs during assembly or use, whereas passive pump diaphragms, which are elastically stretched to store energy that can be used for fluid kinetics, may be formed of an elastomer. For example, first pump type 207 may be formed of an overstretched diaphragm and second pump type 208 may be formed of a microporous elastomer where first pump type is driven by a pneumatic actuation line and second pump type is operated passively, such that fluid driven actively from pump 207 to pump 208 is returned passively by elastic relaxation of diaphragm 208, as is useful in diagnostic applications such as PCR with two-zone thermocycling.

Diaphragms are generally formed of thin films, and while optionally being cast in place, a preferred method is to print them in place by edge-bonded decoupage as will be described with reference to FIG. 3. A broad variety of thin films are suitable for diaphragms, and one of the strengths of the process is to make use of multiple diaphragm materials—each individual diaphragm is fabricated from the film material most suited for the requirements of a particular circuit element, class of circuit elements, or subtype. For instance, there may be a subset of diaphragms fabricated as pump elements, and a second subset of diaphragms fabricated as valve elements. Some pumps may use elastic diaphragms, others may use inelastically overstretched diaphragms to increase stroke volume as described below. In many instances, the diaphragm materials selected for pump and valve fabrication will be different. Subsets of the pumps or valves may require special materials selected for heat resistance, elasticity, chemical resistance, permeability, and so forth, material properties that may not be useful in other fluidic elements in the same circuit.

Diaphragm materials include, for example, a range of polyurethanes (including microporous polyurethanes sold under the tradename FABTEX®), a low density polyethylene/ethylene vinyl acetate/polyvinylidene chloride/ethylene vinyl acetate and low density polyethylene laminate (as sold under the tradename SARANEX®, a porous polytetrafluoroethylene film sold under the tradename MUPOR®, linear low density polyethylene, ethylene vinyl acetate, biaxially oriented polyethylene terephthalate, polyvinylidene chloride, polyimides, and polyolefins. One subtype is fully elastic over the required range of deformation; another subtype has a yield point that is exceeded in making form-in-place diaphragm elements. Certain members are not sufficiently elastic to be useful as elastomeric diaphragms, either because the yield point is too low or because the Young's Modulus is too high. Yet another subtype is microporous and breathable. Some diaphragms are hydrophilic, others are hydrophobic. For certain applications, rupture sensitive or rupture resistant thin films (such as those having a nylon reinforcement or co-laminate) are used. By selecting a diaphragm material optimized for each kind of fluidic element in a microcircuit, improved and surprising properties of the circuitry are realized.

Materials for forming body plate members or layers (101, 102, 103, 104) include polyethylene terephthalate (most preferredly biaxially stretched PET sold as MYLAR®), polycarbonate, polystyrene, polypropylene, polyimide, polyamide, and silicone rubber, while not limited thereto.

The diaphragm members are arrayed between the fluidic plate and the pneumatic plate in registration (using registration marks 210 or other fiducials as known in the art) with corresponding cavities on the opposing surfaces of the body members. The diaphragms may be assembled by contacting a sheet of film against the pneumatic layer and cutting each outline while welding the material onto the substrate, a process termed "cut-welding". The shape of the diaphragm is generally determined by the outline of the cavity which it overlies. A bib or apron of extra material is cut around each shape so that the cavity is sealed. The excess material between the cutouts is then stripped away, for example using an electrostatic pickup roller or an air knife.

FIG. 3 is a block diagram of a process for forming mixed assortments of diaphragm types in a single cartridge. The first stage in assembly employs a process of edge-bonded decoupage to tack or weld the diaphragm members to the pneumatic plate. In a second stage of manufacturing, selected diaphragms may be formed in place. The first stage and second stage will be considered separately.

The first stage of assembly can be broken conceptually into steps. A pair of molded plates are manufactured, cavity and channel features defining a the hydraulic works of a fluidic circuit are embossed, molded or laminated into a first plate or housing, and cavity and channel features defining the pneumatic works of a pneumatic circuit are embossed, molded or laminated into a second manufactured plate or housing.

In a next step, the pneumatic plate 101 is fed into an automated process with pneumatic face up. As shown schematically in FIG. 4, a sheet of a first diaphragm film material (at Station A) is contacted onto the pneumatic face and a robotic laser is used to cut-weld a first subset of diaphragms. The first circuit elements to be formed could include all the valve diaphragms, for example. The laser cuts have the effect of tacking or welding the diaphragm members to the plastic substrate. Each cut is made allowing an extra margin or apron around each diaphragm member which extends past the outside lip of the pneumatic cavity or feature that is covered by the diaphragm. This step is termed "laser edge-bonded decoupage", "laser edge-welded decoupage", or simply "laser decoupage".

In a fourth step, a sheet of a second diaphragm material (at Station B) contacted onto the pneumatic face and a robotic laser is used to cut out a second subset of diaphragms. These might include a second subtype of fluidic elements having elastic diaphragms, for example.

The laser decoupage step can be repeated with as many sheets or rolls of diaphragm materials as are needed for the fluidic circuit, where each sheet or roll is a distinct material that will be used for a particular class of diaphragm types.

Finally, the fluidics plate (having been spotted or printed with any dry reagents to be contained in the cartridge) is fitted face-to-face against the pneumatic plate, sandwiching the aprons of the diaphragm members between corresponding lip surfaces surrounding the various cavities in each plate, and a process of fusion or bonding is applied so that the two plates are sealed together.

Fusion of the two substrates is completed by ultrasonic welding, by solvent welding, by gluing, or by laser assisted thermal fusion, for example. Use of a double sided glue layer can be avoided by pressure treating the plates in combination with UV-activation of surface epoxide groups covalently bound to one of the substrates.

This step results in operational valve and pump diaphragm assemblies encapsulated within their valve and pump cavities. In the process of bonding or fusing the two plates together, the aprons of the diaphragm members are sealed in place bordering the outside walls of the valve and pump cavities so that the diaphragm physically separates the pneumatic and fluidic sides of the circuit.

Assembly may involve additional steps. Where circuit features are brought out onto the outside surfaces of the fused plates, a capping layer is applied on the contralateral faces of the cartridge body to enclose those features.

The device may be tested for continuity and leaks on the fluid side and the pneumatic side. By applying an overpressure on the fluid side, diaphragms can be stretched in place to comply with the shape of the overlying pneumatic cavity. These diaphragms when relaxed, will have a tented appearance like a bubble. This defines a "form-in-place" diaphragm process, as will be described in more detail below.

Figure 4:
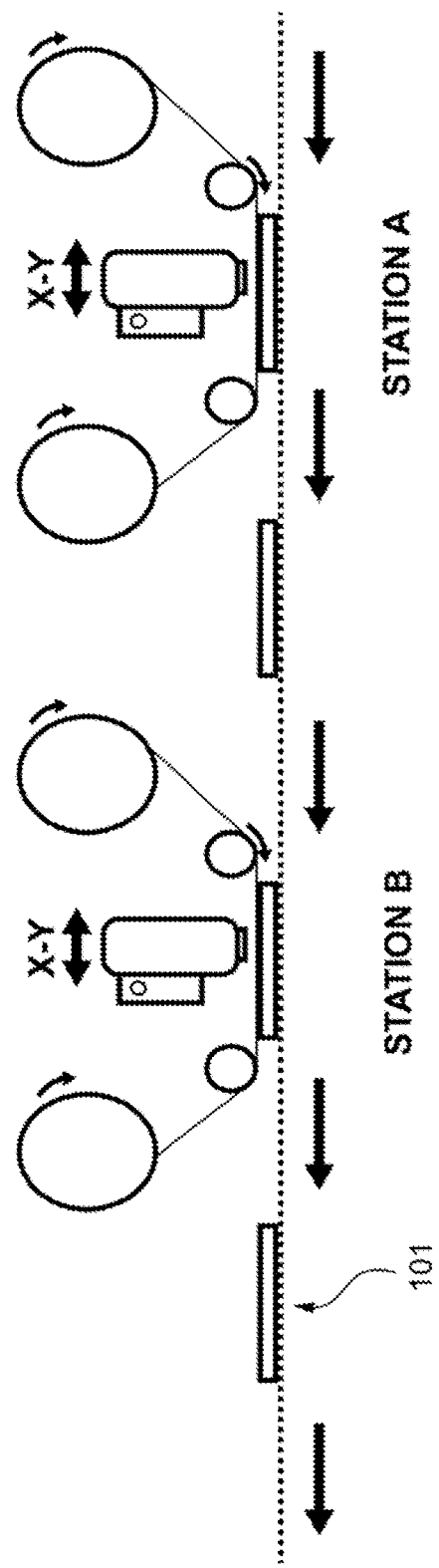
FIG. 4 is a schematic view of an assembly process for edge-bonded laser decoupage of diaphragm members onto a cartridge substrate.

FIG. 4 illustrates part of an assembly line process for edge bonded decoupage of diaphragms. As shown in this schematic, an assembly line belt is used to convey pneumatic cartridge body 101 members under roller assemblies so that a film layer can be closely contacted onto the exposed surface of the substrate at a first workstation (Station A). A robotic laser is used to cut out the shapes of the diaphragms in close registration with corresponding cavities on the substrate, allowing an excess around the margin (termed here an "apron") which will be used to edge seal the diaphragms between the molded pieces. As we have found, the details of the laser cutting process, including wavelength and power output, can be selected so that the cutouts of the diaphragms may be tacked in place, or as in the case of polyurethane elastomers and polyvinylidene chloride, welded to the substrate. Excess material is removed onto a takeup roller, as helped by an air knife if needed, for example. The cartridge assembly advances to a next workstation (Station B), where a second diaphragm material is applied. In this way, products having subsets of several materially discrete diaphragms can be serially printed in place.

In a next operation, which is not shown in the figure, the pneumatic substrate plate is mated face-to-face with the hydraulic substrate plate and the two are fused or bonded together, thus encapsulating the diaphragms inside the finished product. The diaphragms separate the hydraulic cavity from the pneumatic cavity, or from an atmospheric vent.

By trial and error, selected materials have been found to weld or tack onto a plastic substrate in the process of cutting the shapes by laser. Cut welding is typically accomplished with a laser such as a $CO_2$ laser, a Nd:YAG laser, a Holmium laser, and most preferably a laser having an output in the 1.7-10 micron range, and finds application in edge-bonded laser decoupage. $CO_2$ lasers have an output at about 2 um. Fiber lasers having a 2 um output (such as those employing thulium (Tm) doped and holmium (Ho) doped double-clad fibres) are particularly preferred because the output can be finely focused and is in a band that interacts intensely with polymeric materials to a greater depth than a $CO_2$ laser and without the need for absorption enhancers on the surfaces to be welded. Target output is generally less than 100 Watts.

Most plastics do not absorb laser radiation in the region extending from UV to near-IR. Laser welding (conversion of laser radiation into heat) can be performed at wavelengths below about 2 micrometers by polymer sensitization, such as by addition of dyes or an adjunct absorbing layer. But at around 1.7 micrometers, the intrinsic absorptivity of plastic increases due to vibronic excitation. We have found that the preferred laser output frequencies for laser edge-welded decoupage are in the range of 1.7 to 10 micrometers. The advantages of fiber lasers having a 2 micrometer output include higher power and beam quality; higher efficiency and smallest size; flexible fiber beam delivery for high-speed robotic workstations; and efficacy over a wide range of polymers. In some applications, cutting speeds approach several meters per second. If needed, different lasers may be used for cutting and edge-bonding different diaphragm materials.

Hot nip rollers are also found to be useful for edge-bonded decoupage, the sharp edges of the roller serving both to make the cut and weld the film onto the substrate. However, laser cutting is preferred because of the finer detail and quality of the cuts, which permits closer fluidic circuit element packing and increased miniaturization.

Smaller diaphragm elements permit closer spacing of valve and pump arrays, which are often formed into branching circuits operated in parallel for running multiple assay panels in parallel. Larger diaphragm elements are needed, for example, as covers over a common waste receptacle or over reagent packs having diaphragms for pneumatic dispensation of reagent. Specialized diaphragm elements are also used as vents and as optical cuvettes.

Attaching the diaphragm layers to the pneumatic substrate member 101 is mostly a matter of convenience, and is preferred because reagents are typically printed onto the hydraulic substrate. But this is a matter of individual choice and does not limit the practice of the invention.

FIGS. 5A through 5L are views of steps in a process of making a cartridge having four body layers. The 4-layer cartridge process may optionally include a process for laser decoupage of various diaphragm types and a process for overstretching certain valve and pump diaphragms as shown.

Figure 5A:
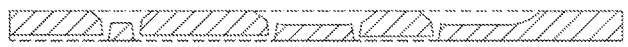
Figure 5B:
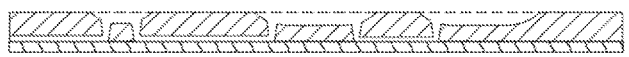
Figure 5C:
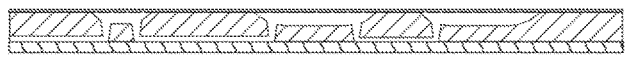
Figure 5D:
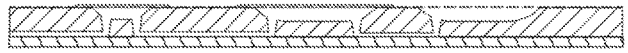
Figure 5E:
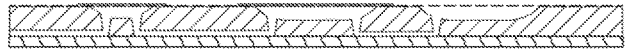
Figure 5F:

In FIG. 5A, a single molded body member is shown. In this exemplary embodiment, the body member shown is a hydraulic body member, and contains fluidic features for forming wettable valves and pumps. FIG. 5B adds a thin layer on top. In FIG. 5C a laser cut-welding process is performed and excess material is trimmed away. In FIG. 5D, a mechanical finger is used to overstretch the diaphragm material, which is chosen for its yield point, resulting in the blistered appearance shown in FIG. 5F. In FIG. 5G, a second thin layer is applied over the upper surface of the first body member. The diaphragm material chosen for close-ended chamber is a microporous elastomer. Excess material is again removed by a process of cutting and welding as shown in FIGS. 5H and 5J. A pneumatic body layer is then bonded in place, securely sandwiching the diaphragms between the two body members. In FIG. 5K, a capping layer is placed over the pneumatic layer. This capping layer includes pneumatic actuation channels that otherwise may be included in the pneumatic layer. Finally, in FIG. 5L, a second capping layer is place underneath the hydraulic body member. By forming the molded hydraulic and pneumatic body members with features on both sides, the capping layer advantageously is a flat plate, simplifying its manufacture.

The fluidic and pneumatic plate body members (generally including at least one pneumatic substrate having features intended for receiving pressurized gas and at least one hydraulic substrate having fluidic features intended for wetting during use) may be formed by a process of molding and are stamped or molded on at least one surface with cavities that serve as fluidic or pneumatic chambers and channels which when interfaced together form a fluidic circuit. The fluidic face of the fluidic plate member is designed to interface with the pneumatic face of the pneumatic plate member. An individual pump cavity may consist of paired cavities on the fluidic and pneumatic sides of the housing and is assembled in a clamshell process. Dried reagents and beads are spotted or printed into the fluidic cavities before the cavity is sealed under its diaphragm. When fully assembled, each diaphragm interfaces between a fluidic chamber or channel and a pneumatic chamber or channel and is used to move fluid through the fluidic circuit under control of pneumatic pulses supplied by a pneumatic interface which is generally under solenoid-actuated control of a microprocessor. The fluidic and pneumatic body members may also be formed by lamination, as will be illustrated in FIGS. 7 and 11, for example.

Advantageously, fluidic and pneumatic features may also extend through the plate substrates so that additional circuit features may be located on the outside face of one or both plates; i.e., contralateral to the faces that will be fused or bonded together. These channels and chambers must also be sealed and this is generally done with a "capping layer". Capping layers may be applied by gluing or by other bonding techniques, and are composed of polyethylene terephthalate or a cyclical polyolefin, for example. Bonding and fusing body layers is accomplished by applying an intermediate glue or ACA (adhesive-core-adhesive) layer between the pieces, but preferred methods include solvent, thermal, molecular, laser or ultrasonic bonding where possible. Recent advances in laser bonding result in essentially seamless fusion between adjoining pieces.

At this stage, manufacturing may be complete, or a pressure-driven "form-in-place" process may be used to shape selected diaphragms. Adding capping layers to any outside surface which bear circuit features in negative relief may be completed at any stage of the process.

Figure 6:
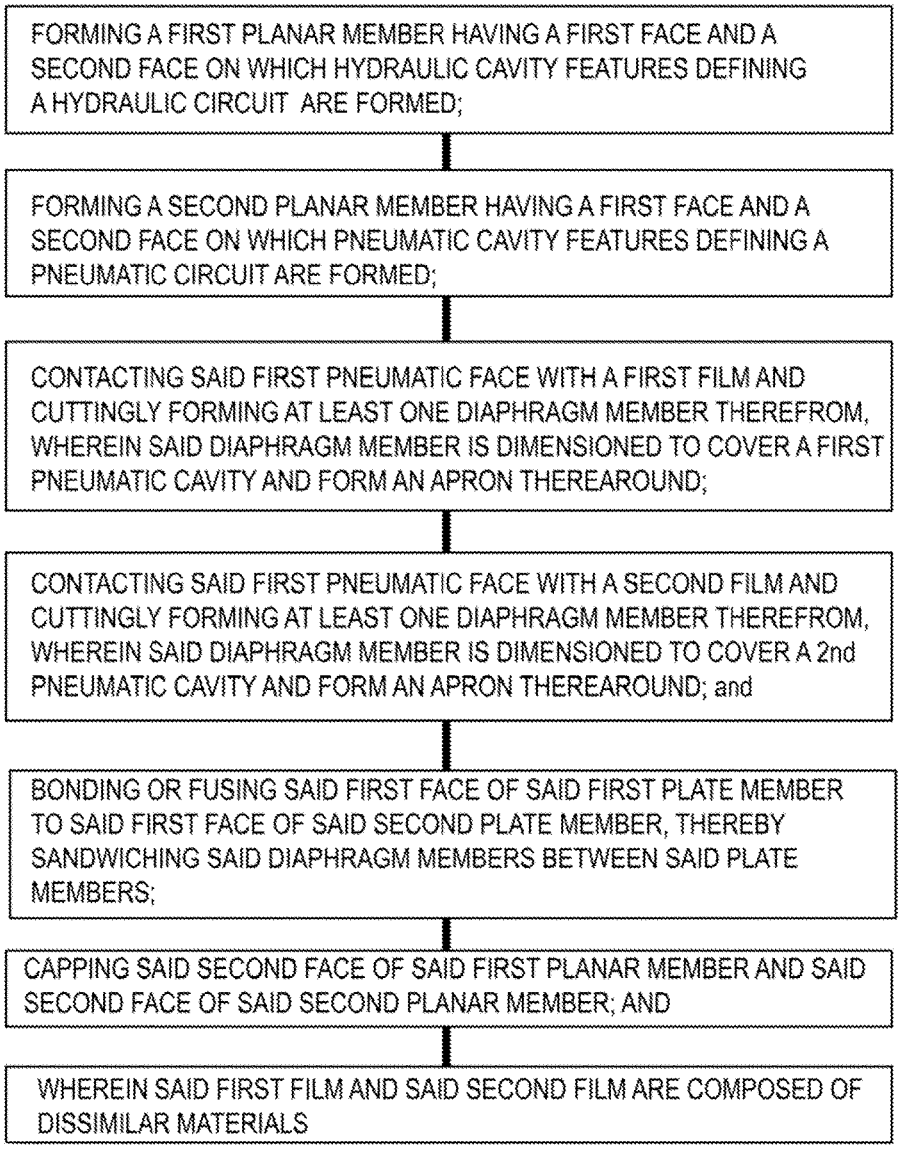
FIG. 6 is a block diagram view of a process for manufacturing a fluidic cartridge having a plurality of circuit element subtypes, each characterized by distinct and dissimilar diaphragm materials.

FIG. 6 is a block diagram view of a process for manufacturing a fluidic cartridge having a plurality of circuit element subtypes, each characterized by distinct and dissimilar diaphragm materials.

FIGS. 7A through 7L are views of steps in a process of making a cartridge having four body layers. The 4-layer cartridge process may optionally include a process for mechanical decoupage of various diaphragm types and a process for overstretching certain valve and pump diaphragms as shown.

Figure 7A:
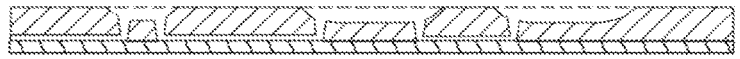
FIGS. 7A through 7L are views of steps in a process of making a cartridge having four body layers using mechanical decoupage.
Figure 7B:
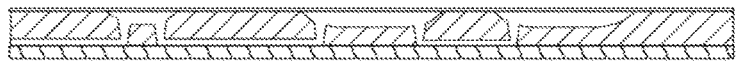
Figure 7C:
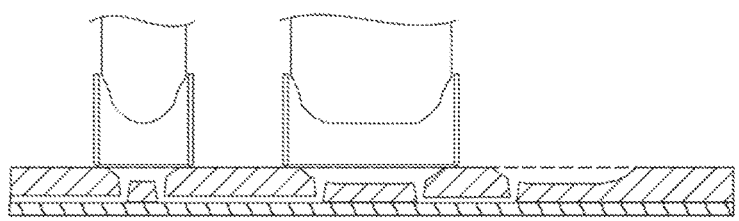
Figure 7D:
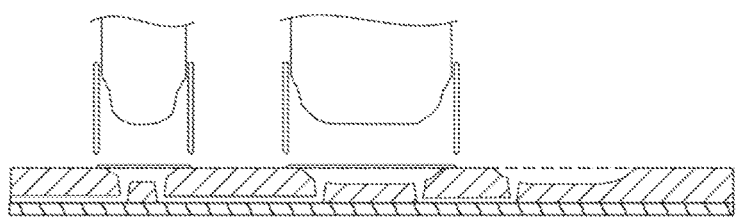
Figure 7E:
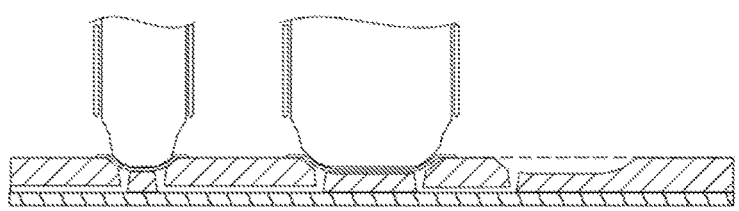
Figure 7F:
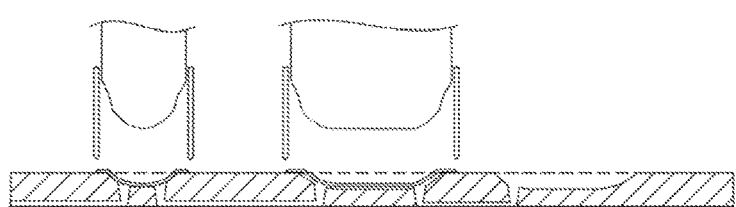
Figure 7G:
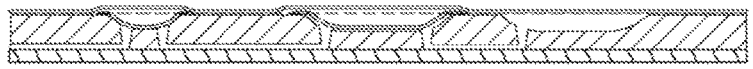
Figure 7H:
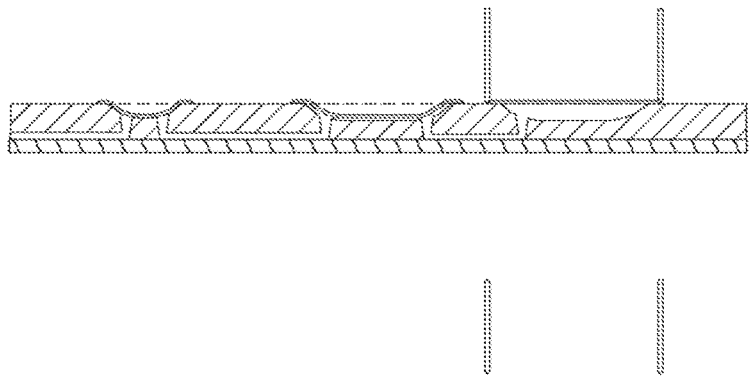
Figure 7I:
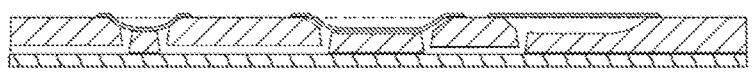
Figure 7J:
Figure 7K:
Figure 7L:

In FIG. 7A, a single molded body member is shown. In this exemplary embodiment, the body member shown is a hydraulic body member, and contains fluidic features for forming wettable valves and pumps. FIG. 7B adds a thin layer on top. In FIG. 7C a cutting process is performed and excess material is trimmed away. The cutting process also welds or tacks two diaphragms to the body member, such as by thermal bonding. In FIG. 7D, a mechanical finger is used to overstretch the diaphragm material, which is chosen for its yield point, resulting in the blistered appearance shown in FIG. 7F. In FIG. 7G, a second thin layer is applied over the upper surface of the first body member. The diaphragm material chosen for close-ended chamber is a microporous elastomer. Excess material is again removed by a process of cutting and welding as shown in FIGS. 7H and 7J. A pneumatic body layer is then bonded in place, securely sandwiching the diaphragms between the two body members. In FIG. 7K, a capping layer is placed over the pneumatic layer. This capping layer includes pneumatic actuation channels that otherwise may be included in the pneumatic layer. Finally, in FIG. 7L, a second capping layer is place underneath the hydraulic body member. By forming the molded hydraulic and pneumatic body members with features on both sides, the capping layer advantageously is a flat plate, simplifying its manufacture.

The fluidic and pneumatic plate body members (generally including at least one pneumatic substrate having features intended for receiving pressurized gas and at least one hydraulic substrate having fluidic features intended for wetting during use) may be formed by a process of molding and are stamped or molded on at least one surface with cavities that serve as fluidic or pneumatic chambers and channels which when interfaced together form a fluidic circuit. The fluidic face of the fluidic plate member is designed to interface with the pneumatic face of the pneumatic plate member. An individual pump cavity may consist of paired cavities on the fluidic and pneumatic sides of the housing and is assembled in a clamshell process. Dried reagents and beads are spotted or printed into the fluidic cavities before the cavity is sealed under its diaphragm. When fully assembled, each diaphragm interfaces between a fluidic chamber or channel and a pneumatic chamber or channel and is used to move fluid through the fluidic circuit under control of pneumatic pulses supplied by a pneumatic interface which is generally under solenoid-actuated control of a microprocessor. The fluidic and pneumatic body members may also be formed by lamination.

Advantageously, fluidic and pneumatic features may also extend through the plate substrates so that additional circuit features may be located on the outside face of one or both plates; i.e., contralateral to the faces that will be fused or bonded together. These channels and chambers must also be sealed and this is generally done with a "capping layer". Capping layers may be applied by gluing or by other bonding techniques, and are composed of polyethylene terephthalate or a cyclical polyolefin, for example. Bonding and fusing body layers is accomplished by applying an intermediate glue or ACA (adhesive-core-adhesive) layer between the pieces, but preferred methods include solvent, thermal, molecular, laser or ultrasonic bonding where possible. Recent advances in laser bonding result in essentially seamless fusion between adjoining pieces.

At this stage, manufacturing may be complete, or a pressure-driven "form-in-place" process may be used to shape selected diaphragms. Adding capping layers to any outside surface which bear circuit features in negative relief may be completed at any stage of the process.

Figure 8A:
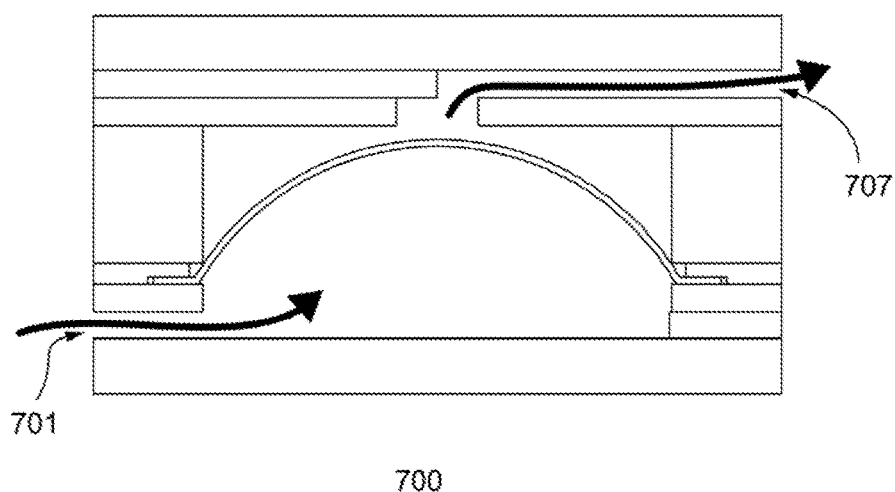
FIG. 8A illustrates a cartridge body built by lamination.
Figure 8B:
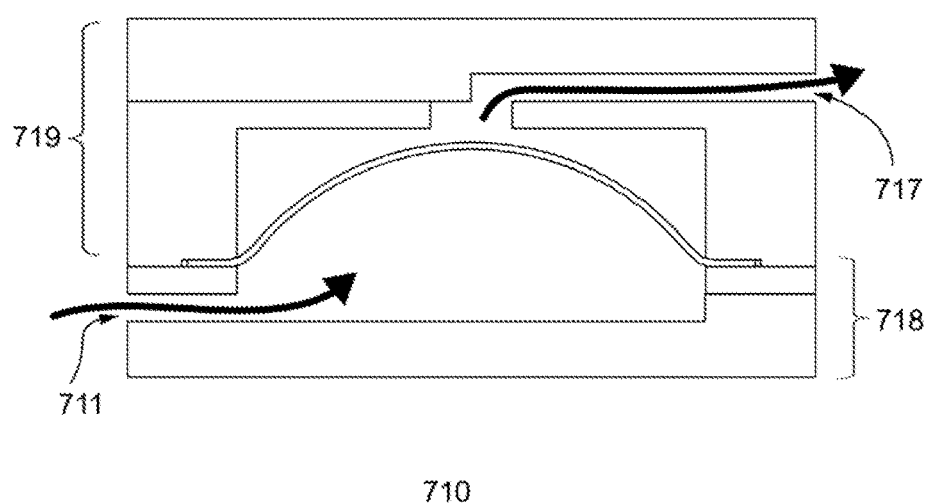
FIG. 8B illustrates a 4-layer cartridge body having molded features. The fluidic element illustrated a dead end channel with breathable diaphragm for fluid loading.

FIG. 8A illustrates a cartridge body 700 built by lamination; FIG. 8B illustrates a 4-layer cartridge body 710 having molded features. The fluidic element illustrates a dead end channel with breathable microporous diaphragm for fluid loading, where the circuit terminates in a chamber with no outlet. Fluid enters the chamber shown here through an inlet (701, 711) and fills the chamber, but gas cannot be displaced in chambers of this type having diaphragms of the prior art. However, by supplying a diaphragm of a microporous polyurethane, which is an elastomer, gas in the chamber is vented through the diaphragm as shown and exits vent (707, 717). Once wetted, the diaphragm swells with the fluid ingress under upstream pressure, and will passively expel the fluid went the upstream pressure is removed, thus behaving as a passive pumping system.

Chambers of this kind can be used for reagent additions where a dried reagent is stored in the chamber, and for thermocycling, for example, where a pair of pumps are slaved so that one is actuated pneumatically, and the second is a dead end chamber that is filled under pressure (while venting gas through the diaphragm) and then passively returns the fluid upstream due to its spring force.

The device of FIG. 8B can be made for example by first manufacturing the hydraulic subassembly 718, and then sandwiching the diaphragm between the hydraulic subassembly and a second subassembly 719 in a clamshell. The diaphragm may made in a separate process if desired, for example by a process of blow molding or vacuum forming, and then assembled in place.

Figure 9A:
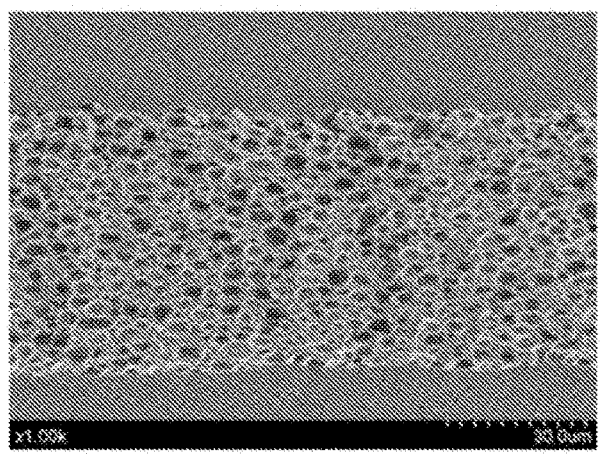
FIGS. 9A, 9B and 9C are graphical illustrations of the fine structure of a breathable microporous polyurethane film at three magnifications.
Figure 9B:
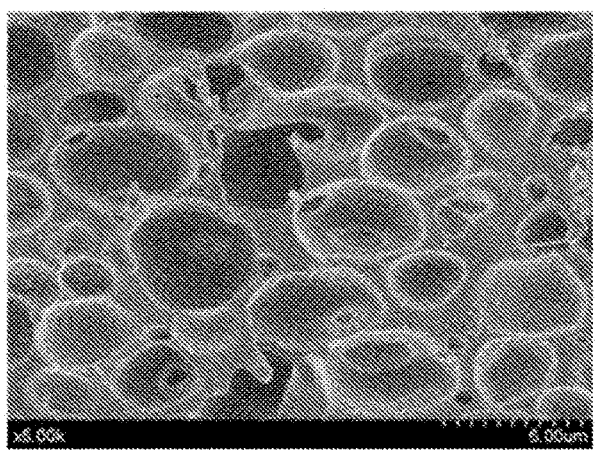
Figure 9C:
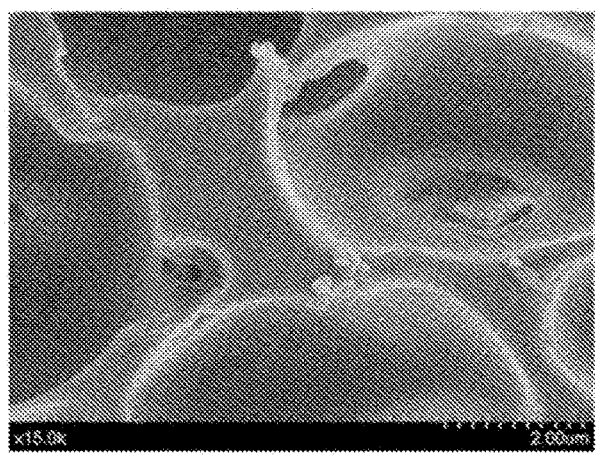

FIGS. 9A, 9B and 9C are graphical illustrations of the fine structure of a breathable microporous polyurethane film at three magnifications. A porous, fractured cellular structure is readily visible with increasing magnification by scanning electron microscopy. Microporous polyurethanes include films sold as "PORELLE®" membranes (PIL Membranes Ltd, Kings Lynn, Norfolk UK). These polyurethanes can preferably be hydrophobic, but hydrophilic films may also be useful. One example is Porelle 355. Such diaphragm members may be selected from films that are elastomeric if desired.

Other microporous polymers are also known and function analogously. Microporous forms of polytererefluoroethylene (PTFE) sold under the tradename MUPOR® (Porex, Fairburn Ga.) are readily yielded in place using hydraulic pressure. The resulting diaphragms have good permeability to gas and can be used as vents, and the hydrophobicity results in selective blockage of water leakage if desired. In an unexpected solution to a technical problem, microporous polyurethane films may thus be used to form diaphragm members in closed-end channels, where ingress of liquid into a terminal chamber is possible only by directly venting the resident air through a permeable diaphragm. In some applications, these diaphragms initially release air, but when wetted, permeability to air is substantially decreased, thus the diaphragm to a zero-air entrapment, self-priming pump for close-ended channels, where advantageously the pump becomes an active pneumatic micropump once all air in the line is vented and the film is wetted.

Figure 10A:
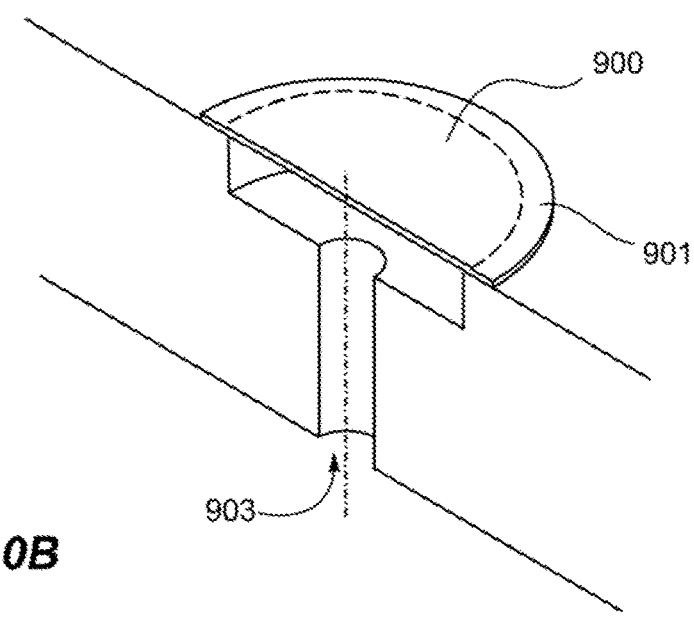
FIGS. 10A and 10B are renderings of a diaphragm member being stretched by a process of stretching a thin film. The process may be elastic (i.e., recoverable) or inelastic (i.e., resulting in permanent deformation by exceeding the yield point of the material). Unlike elastic materials, yielded diaphragm subtypes do not elastically recover but instead form a bubble- or blister-shape having an overstretched web.
Figure 10B:
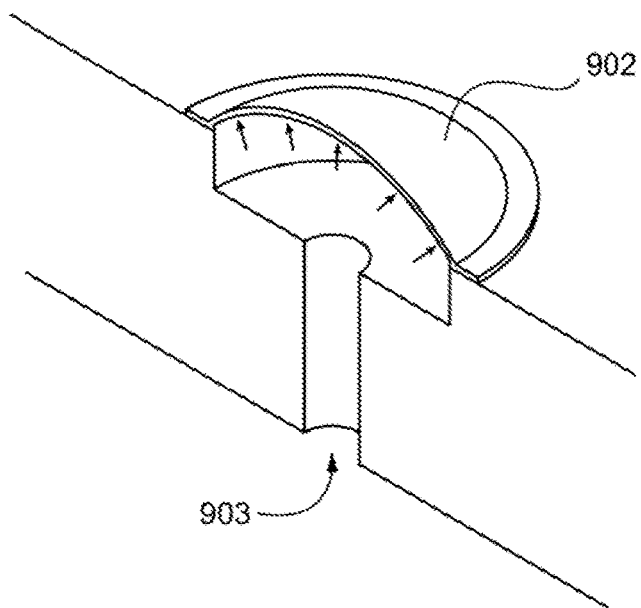

FIGS. 10A and 10B are renderings of a diaphragm member 900 being stretched by a process of stretching a thin film. The process may be elastic (i.e., recoverable) or inelastic (i.e., resulting in permanent deformation by exceeding the yield point of the material). Unlike elastic materials, yielded diaphragm subtypes do not elastically recover but instead form a bubble- or blister-shape (902, shown in FIG. 10B) that may collapse when depressurized.

In this case, a simplified pneumatic substrate is shown with a circular diaphragm cutout applied thereon. The cutout includes a well-defined apron 901 that overlaps and extends outside the periphery of the cavity over which the diaphragm is applied. The outside edge of the apron is bonded to the underlying substrate so that the diaphragm may be pressurized through inlet 903.

When pressure is applied from within the cavity (here shown in cutaway view) the diaphragm film will stretch according to its Young's modulus. An elastic material will rebound when the pressure is removed, but for that class of materials having a yield point that is exceeded by the applied force, the material will be permanently stretched and deformed. This is the basis of the "form-in-place" diaphragm process, which may be applied to make "form-in-place" pumps and valves having improved latency times and are less likely to stick closed. In one process, the diaphragm material is stretched to take on and comply with the female shape of the cavity into which it is forced. Thus for a process that exceeds the yield point of the thin film material, the figures demonstrate how a diaphragm pump can be formed by a form-in-place process of yielding a plastic film. The difference in enclosed volume between the stretched (lower) and unstretched (upper) diaphragm is the ejection stroke volume of the pump. Thus the process of manufacturing mimics the process of pumping and ensures a consistent stroke volume. This was first noted with films that were not resilient elastomers, but had been chosen for chemical resistance. A particular film in this class was a co-laminate of a polyethylene terephthalate or vinylidene chloride sandwich disposed between layers of polyethylene, which is valued for its chemical resistance. This material is sold under the tradename SARANEX®. We discovered that first ejection stroke volume of a virgin film was significantly less than second or third ejection stroke volume of a formed-in-place stretched film under normal conditions of use.

Figure 11:
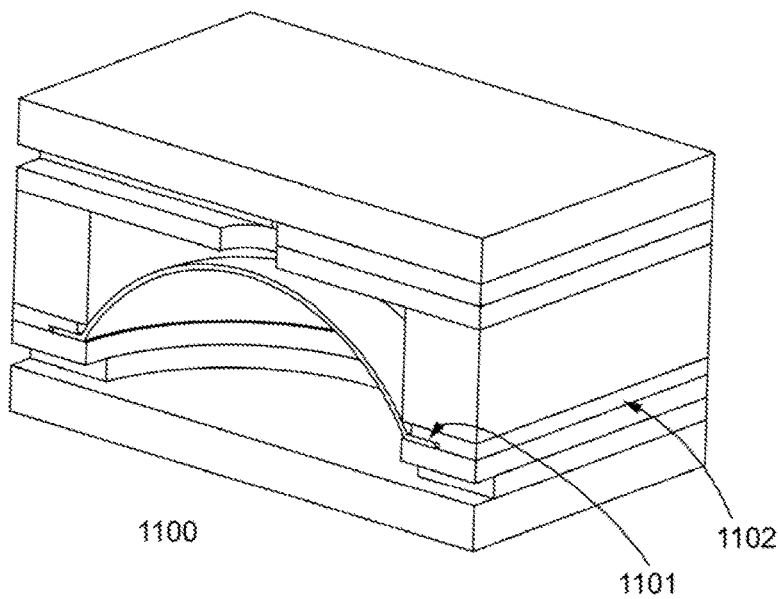
FIG. 11 is a cutaway view of a pneumatically driven micropump in a laminated body.

FIG. 11 is a cutaway view of a micropump 1100. The diaphragm with apron 1101 is seen to have a convex "bubble" or blister appearance 1110. The blister is a collapsible blister in the case of inelastic overstretched diaphragms and an elastic blister in the case of elastic diaphragms. Also shown in the figure is the apron 1101 used to seal the diaphragm between the pneumatic housing members (upper layers) and the fluidic housing members (lower layers). The apron in this example is contacted by a glue layer 1102 that bonds the fluidic face to the pneumatic face of the device, as is representative of laminated construction. However, lamination of molded parts is also conceived, and thus the construction details used in making mixed diaphragm devices may be varied and are not exclusive to lamination or molding.

Figure 12A:
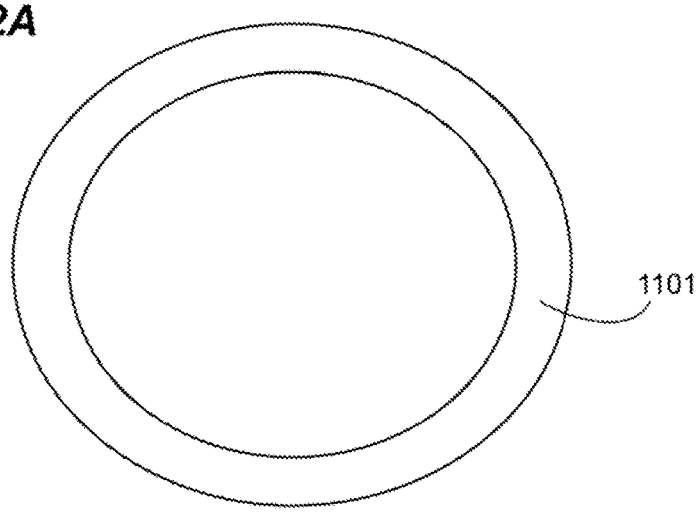
FIGS. 12A and 12B are a plan view and elevation views of a form-in-place diaphragm member for a micropump measuring a few millimeters in diameter. The pump diaphragm member is may be formed in situ by a process of edge-bonded decoupage from an elastomer, a microporous polymer, a stretchable polymer, and optionally may be followed by a process of inelastic deformation, for example, according to the application.
Figure 12B:
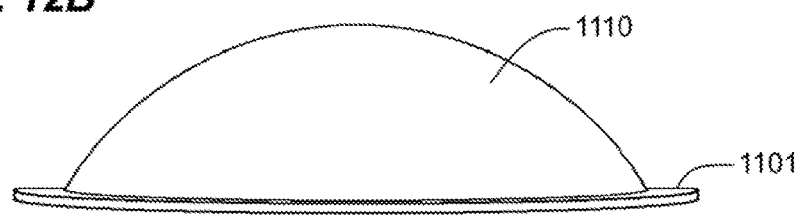

FIGS. 12A and 12B are a plan view and elevation views of a form-in-place diaphragm member for a micropump measuring a few millimeters in diameter. The pump diaphragm member is may be formed in situ by a process of edge-bonded decoupage from an elastomer, a microporous polymer, a stretchable polymer, and optionally may be followed by a process of inelastic deformation, for example, according to the application.

Figure 13A:
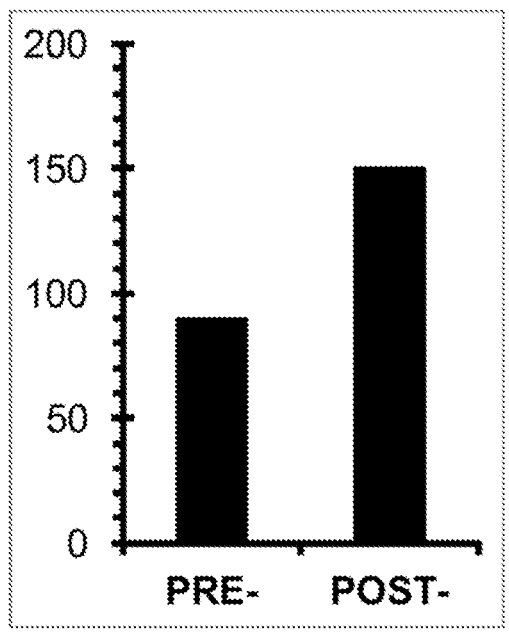
FIGS. 13A and 13B illustrate pump ejection stroke volume of an overstretchable polymer film before (PRE-) and post (POST-) stretch past the yield point. Data is presented for two diaphragm diameters.
Figure 13B:
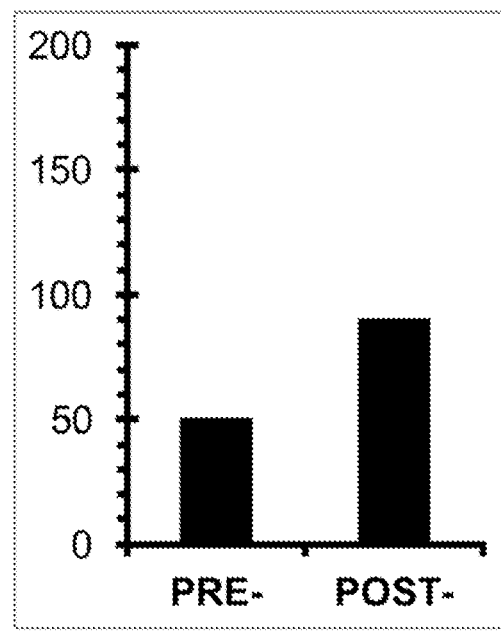

Stroke volume maturation is shown in FIGS. 13A and 13B. Ejection stroke volume of a stretchable plastic film before (PRE) and post (POST) stretch past the yield point is shown to result in a gain in stroke volume. As a matter of quality control and reproducibility of operation, it has proved advantageous to perform this stretching process prior to release of product or to conduct a "warm up" operation in the field prior to use of fluidic cartridges having these diaphragms. Advantageously, once complete, the stretched diaphragms operate with a fixed stroke volume that is no longer dampened by the elasticity of the film as had been problematic with pumps and valves of the prior art.

As shown in FIG. 13A, ejection stroke volume for a SARANEX® diaphragm having a diameter of about 1.08 cm was found to increase from about 90 microliters (PRE) to 150 microliters (POST) by stretching. The nominal size of the pumping chamber limits further stretching and ensures a high level of consistency in the manufactured product.

Similarly, as shown in FIG. 13B, a diaphragm having a diameter of about 0.88 cm was found have an ejection stroke volume of 50 microliters (PRE-) before stretching and about 90 microliters (POST-) after stretching. Again the film was constrained from further stretching by the size of the pump chamber. Films which had been stretched assumed the shape of the pump chamber when relaxed and could be stored in this way without further deformation.

FIGS. 14A and 14B are cross-sectional views of a microvalve 1300 structure, showing "ON" and an "OFF" pneumatic control of the valve diaphragm. The valve diaphragm member is may be formed by a process of edge-bonded decoupage from an elastomer, a microporous polymer, a stretchable polymer, for example.

The valve body is formed of four layers which include two outside capping layers and a molded core formed by fusion of a pneumatic plate member and a fluidic plate member. The capping layers are shown as part of a subassembly, where the hydraulic body member and bottom capping layer form a first subassembly 1310 and the pneumatic body member and top capping layer form a second subassembly 1311. A diaphragm is sandwiched between the two plates and rests on the valve seat. Two fluidic channels are shown entering the valve cavity through dual ports in a valve seat; the ports are separated by a valve sill. In the closed position, the valve diaphragm seats on the valve sill and is pressurized (pneumatic actuation port 1305) to resist flow of fluid from one channel to another. In the open position (FIG. 14A), the diaphragm is retracted into the valve cavity and fluid is free to flow across the valve sill.

The microvalve is formed in a plastic body shown here with 4 layers. The microvalve includes a valve cavity, where valve cavity is defined by a first surface and a second surface enclosing the valve cavity therebetween, the first surface defining a valve seat and the second surface apposing the first surface at a lip bounding the cavity; a diaphragm member with apron peripherally defined therearound, wherein the apron is sealedly inserted into the body under the lip so as to separate the first surface from the second surface; a first fluidic channel entering the valve cavity through the valve seat at a first port; a second fluidic channel entering the valve cavity through the valve seat at a second port; a valve sill defined on the first surface between the first port and the second port; and further wherein the diaphragm member is capable of being reversibly deflected against and retracted from the valve sill, thereby having an "ON" position and an "OFF" position for allowing or not allowing flow of a fluid between the first channel and the second channel.

The microvalve may be further characterized by the species of diaphragm member encapsulated therein. The diaphragm material may be, for example, a co-laminated plastic film having a yield strength such that first actuation of the valve permanently deforms the film to conform in place to the female contour of the cavity surface; a film having a vinylidene chloride polymer layer disposed between layers of polyethylene and sold under the tradename of SARANEX®; a film comprising a low density polyethylene/ethylene vinyl acetate/polyvinylidene chloride/ethylene vinyl acetate and low density polyethylene; a breathable plastic film such that gas is transmitted bidirectionally in response to a pneumatic pressure even when wetted; a film composed of a hydrophobic, microporous, gas permeable polyurethane; or, a film composed of FABTEX®, while not limited thereto. SARANEX®, polyvinylidene chloride ethylene vinyl acetate, for example, are chosen for their form-in-place properties; FABTEX® for their elasticity; grades of FABTEX® for their breathability in making hydrophobic liquid impermeable/gas permeable barrier films, vents and breathable diaphragms. Of interest for applications as diaphragm materials are linear low density polyethylene, ethylene vinyl acetate, biaxially oriented polypropylene, polyvinylidene chloride, microporous polyurethanes, polypropylenes, and polyolefins.

Figure 15:
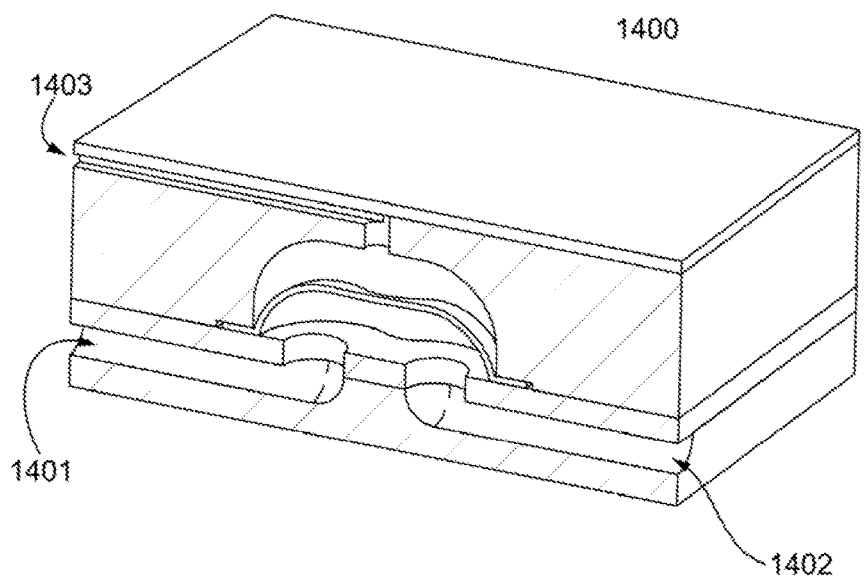
FIG. 15 is a cutaway view of a microvalve in a 4-layered body with molded body features.

FIG. 15 is a cutaway view of a microvalve in a 4-layered body with molded body features. Shown are inlet 1401, outlet 1402, and pneumatic actuation port 1403, although the labeling of inlet and outlet is arbitrary. In one embodiment, having a yielded diaphragm, the valve diaphragm retains its stretched shape after depressurization and is thus supplied for use in the "OPEN" position. Application of pressure through the pneumatic control line collapses the diaphragm against the valve seat and rapidly turns the valve "OFF".

Figure 16A:
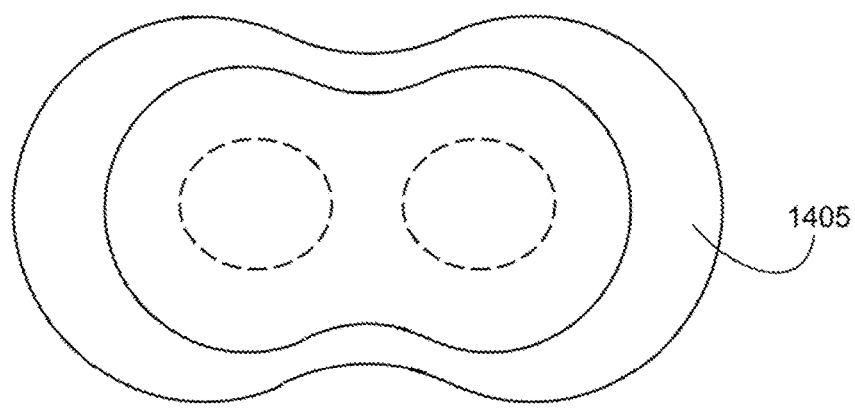
FIGS. 16A and 16B are plan and elevation views of a valve diaphragm in an elastically recoverable or inelastically collapsible blister-shape.
Figure 16B:
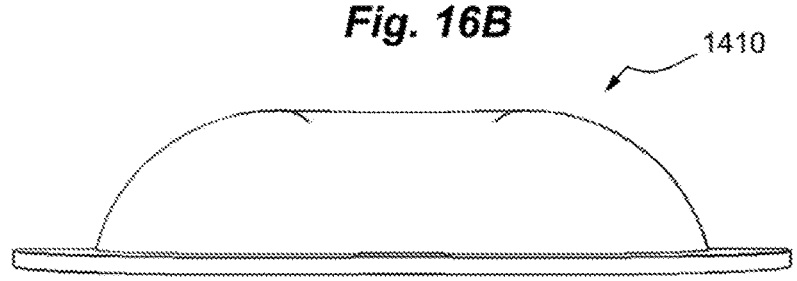

Plan and elevation views show a valve diaphragm with apron 1405 and a diaphragm web in an elastically recoverable or inelastically collapsible blister-shape 1410 having a generally "peanut" shape. The peanut shape can be seen more clearly in FIG. 16A. FIG. 16B is an elevation/perspective view of a form-in-place diaphragm member for a fluidic microvalve.

Figure 17:
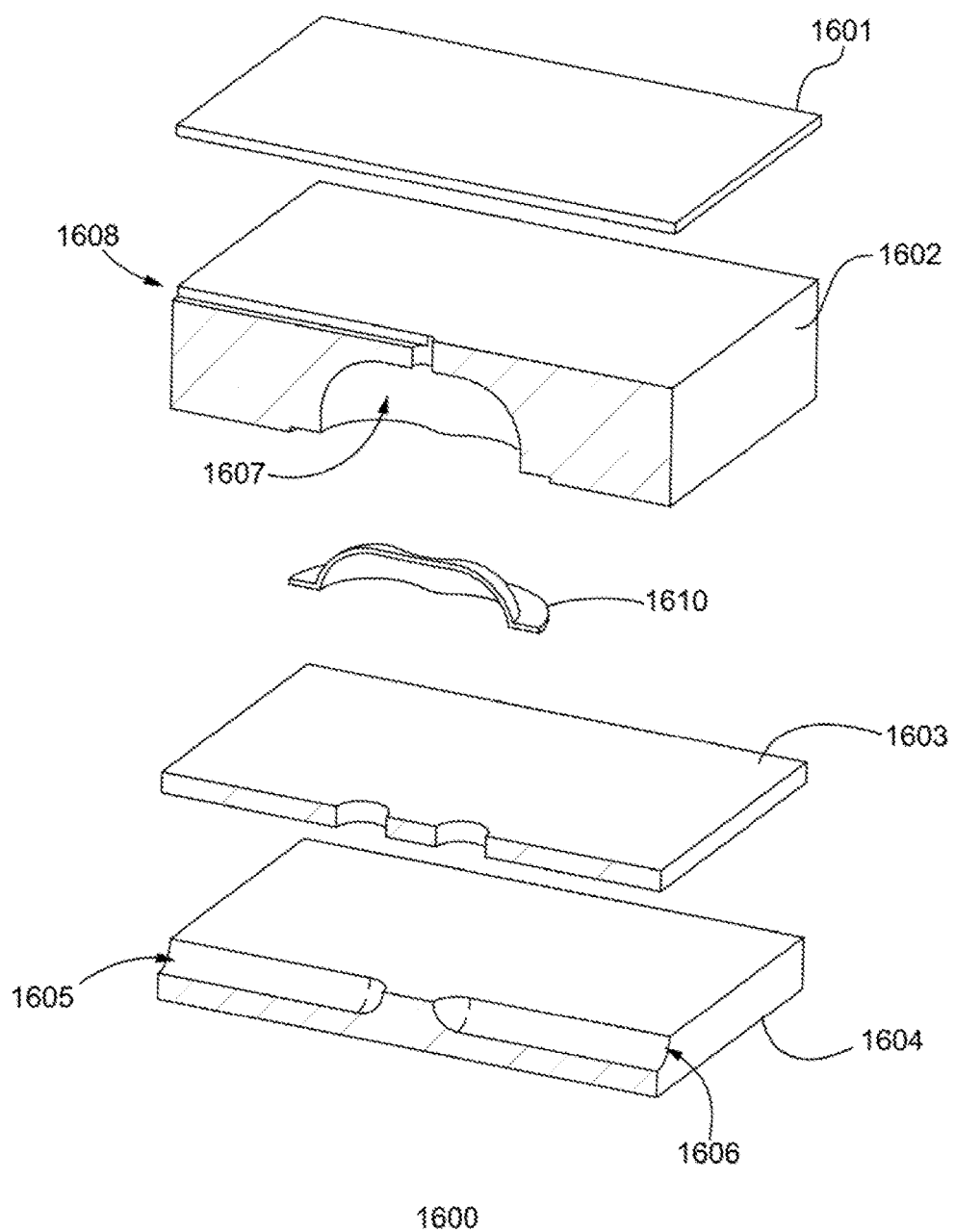
FIG. 17 is an exploded view of a 4-layered body structure of a microvalve with diaphragm.

FIG. 17 is a cutaway view in perspective of a microvalve 1600. In this instance the footprint of the valve has a roughly peanut shape with an obvious waist bounding the valve sill. The valve body is formed of four body layers, a top capping layer 1601, a pneumatic layer 1602, a hydraulic layer with valve seat 1603, and a bottom capping layer 1604, shown here with inlet 1605 and outlet 1606 channels. Also depicted are pneumatic cavity 1607 and actuation port 1608. Diaphragm 1610 has a characteristic blister appearance when distended. The diaphragm may be an elastomer such that the blister is manifested when suction is applied through suction port 1608, and rests flat on the valve seat when relaxed. Alternatively the diaphragm may be a polymer that has been yielded by a process of stretching it past its elastic limit. The method permits selection of the diaphragm material according to the nature of the fluidic circuit under construction.

Figure 18A:
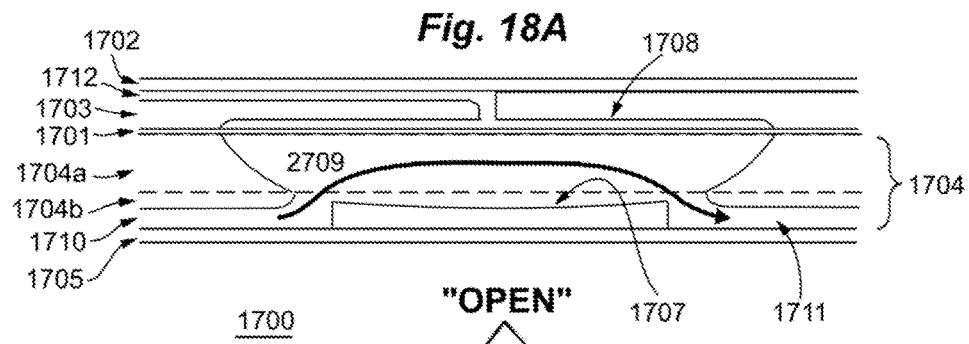
FIGS. 18A and 18B are action views of an alternate embodiment of microvalve in a 4-layered cartridge body. The valve is open when depressurized and closed when pressurized. When an elastomeric diaphragm is used, the valve opens passively when depressurized. When a form-in-place diaphragm is used, the valve is closed until vacuum is applied to the pneumatic cavity.
Figure 18B:
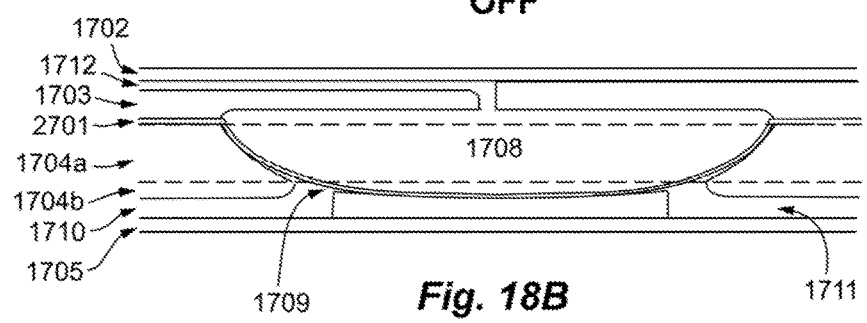

As shown in FIG. 18, embodiments of the invention may be used to insert microvalves having zero deadspace that are fluidically "OPEN" or are fluidically "OFF" when shipped. Application of a pressure pulse to the fluid side (and optionally zero or suction pressure on the pneumatic side), readily allows the valve to open (FIG. 18A). The "OFF" valve configuration as shown in FIG. 18B.

The valves may be constructed by lamination or by fusion of molded body parts as shown here. Shown here are top capping layer 1702, diaphragm 1701, pneumatic body layer 1703, hydraulic layers (1704a, 1704b), and bottom capping layer 1705. Also shown are valve seat 1707, pneumatic cavity 1708, hydraulic cavity 1709, first fluidic channel 1710, second fluidic channel 1711 and pneumatic actuation circuit 1712. The dark arrow indicates fluid flow when the valve is in the "OPEN" position (FIG. 18A). The double arrow indicates transition from the "OPEN" position to the "OFF" position, where fluid flow is blocked by the distended diaphragm on the valve seat 1707 (FIG. 18B). In short, the valves may be operated to open passively, an advance in the art.

Figure 19:
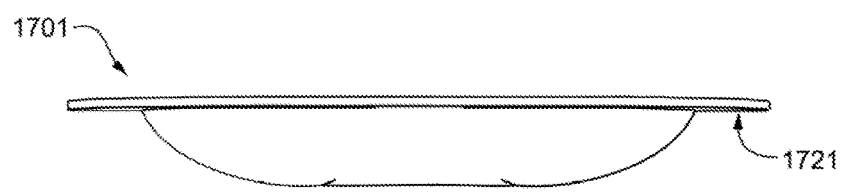
FIG. 19 is a perspective view of a blistered diaphragm, as can be elastically or inelastically formed. In one embodiment, the valve may be formed by a process of edge-bonded decoupage followed by inelastic deformation as demonstrated schematically in FIG. 5 or 7, for example.

FIG. 19 is a view of a yielded-in-place, bilobately stretched diaphragm or "blister" such as would be formed in place within the body of a device 1700, and is surrounded by an apron 1721 such as is pinched between the body layers around the edges to sealedly separate the hydraulic cavity and the pneumatic cavity of the microvalve.

Referencing FIG. 18, a four-layered body is shown forming a microvalve. The diaphragm layer is sandwiched between a pneumatic body member and a hydraulic body member, both of which are molded parts. Capping layers on the top and bottom are needed to seal ancillary circuits on the outside surfaces of body core (central two layers). Thus a 4-layer device, which optionally may be assembled without intermediate ACA glue layers, is realized. The diaphragm may be an elastomer or may be an overstretched polymer having been yielded beyond its yield strength.

INCORPORATION BY REFERENCE

All of the U.S. patents, U.S. patent application publications, U.S. patent applications, foreign patents, foreign patent applications and non-patent publications referred to in this specification and related application data sheets, including but not limited to U.S. patent application Ser. No. 61/745,335, are incorporated herein by reference in their entirety.

Unless the context requires otherwise, throughout the specification and claims which follow, the word "comprise" and variations thereof, such as, "comprises" and "comprising" are to be construed in an open, inclusive sense, that is as "including, but not limited to". The term "a" or "an" as used in the claims does not exclude a plurality.

The appended claims are not to be interpreted as including means-plus-function limitations, unless such a limitation is explicitly recited in a given claim using the phrase "means for."

While there is provided herein a full and complete disclosure of the preferred embodiments of this invention, it is not desired to limit the invention to the exact construction, dimensional relationships, and operational features shown and described. Various modifications, alternative constructions, changes and equivalents will readily occur to those skilled in the art and may be employed, as suitable, without departing from the true spirit and scope of the invention. Such changes might involve alternative components, structural arrangements, sizes, shapes, forms, functions, operational features or the like.

In general, in the following claims, the terms used in the written description should not be construed to limit the claims to specific embodiments described herein for illustration, but should be construed to include all possible embodiments, both specific and generic, along with the full scope of equivalents to which such claims are entitled. Accordingly, the claims are not limited by the disclosure.

We claim:

1. A fluidic device comprising a body comprising a stack of four body layers: a first body layer; a second body layer; a third body layer; and a fourth body layer, said body enclosing a hydraulic microcircuit for moving a fluid, wherein:
   i) a plurality of diaphragm members are sealedly sandwiched between said second body layer and said third body layer;
   ii) said plurality of diaphragm members comprise a plurality of thin film materials;
   iii) said plurality of thin film materials are dissimilar materials comprising an irreversibly stretchable thin film and an elastomeric breathable thin film; and
   iv) said fluidic device is configured such that movement of said fluid in said hydraulic microcircuit is powered and controlled by at least one diaphragm member of a pneumatic microcircuit operatively linked thereto.

2. The fluidic device of claim 1, wherein said hydraulic microcircuit of said stack is formed in said second body layer of said stack and said pneumatic microcircuit of said stack is formed in said third body layer thereof.

3. The fluidic device of claim 1, wherein said at least one diaphragm member is sealedly sandwiched between said second body layer and said third body layer.

4. The fluidic device of claim 1, wherein said first body layer and said fourth body layer are capping layers.

5. The fluidic device of claim 1, wherein said second body layer and said third body layer are molded members.

6. The fluidic device of claim 1, wherein said second body layer and said third body layer are laminated members.

7. The fluidic device of claim 1, wherein said at least one diaphragm member is formed by edge-bonded decoupage.

* * * * *